United States Patent [19]
Lee et al.

[11] Patent Number: 5,748,545
[45] Date of Patent: May 5, 1998

[54] MEMORY DEVICE WITH ON-CHIP MANUFACTURING AND MEMORY CELL DEFECT DETECTION CAPABILITY

[75] Inventors: Peter W. Lee, Saratoga, Calif.; Hsing-Ya Tsao; Fu-Chang Hsu, both of Hsin-Chu, Taiwan

[73] Assignee: Aplus Integrated Circuits, Inc., Saratoga, Calif.

[21] Appl. No.: 834,775

[22] Filed: Apr. 3, 1997

[51] Int. Cl.$^6$ .............. G11C 7/00; G11C 8/00; G11C 29/00

[52] U.S. Cl. .............. 365/201; 365/200; 365/230.06; 365/189.11; 365/203; 371/21.1

[58] Field of Search .............. 365/201, 230.06, 365/189.11, 203, 204, 200, 185.09, 185.13, 185.25, 185.33; 371/21.1

[56] References Cited

U.S. PATENT DOCUMENTS

| | | | |
|---|---|---|---|
| 4,914,632 | 4/1990 | Fujishima et al. | 365/201 |
| 5,343,431 | 8/1994 | Ohtsuka et al. | 365/201 |
| 5,351,214 | 9/1994 | Rouy | 365/210 |
| 5,400,344 | 3/1995 | Mori | 365/201 |
| 5,428,621 | 6/1995 | Mehrotra et al. | 371/21.4 |
| 5,539,694 | 7/1996 | Rouy | 365/189.09 |
| 5,606,527 | 2/1997 | Kwack et al. | 365/201 |

*Primary Examiner*—David C. Nelms
*Assistant Examiner*—Trong Phan
*Attorney, Agent, or Firm*—Flehr Hohbach Test Albritton & Herbert LLP

[57] ABSTRACT

A memory device with an on-chip manufacturing and memory cell defect detection capability includes a memory array with a plurality of memory cells that are organized in rows and columns, a plurality of word lines that interconnect respectively the rows of memory cells, and a plurality of bit lines that interconnect respectively the columns of memory cells. Global word line short and global word line open testing circuits are provided to detect the presence of a word line short or word line open condition. Local word line short and local word line open testing circuits are provided to identify the defective word line. Global bit line short and global bit line open testing circuits are provided to detect the presence of a bit line short or bit line open condition. A local bit line short/open testing circuit is used to identify the defective bit line. Short circuiting between word lines and bit lines, and the maximum and minimum threshold voltages of the memory cells can also be detected in the disclosed memory device.

40 Claims, 17 Drawing Sheets

MEMORY DEVICE WITH ON-CHIP MANUFACTURING AND MEMORY CELL DEFECT DETECTION CAPABILITY

BACKGROUND OF THE INVENTION

1. Field of the Invention

The invention relates to memory devices, more particularly to a memory device with an on-chip manufacturing and memory cell defect detection capability for detecting word line short, word line open, bit line short and bit line open manufacturing defects, as well as memory cell defects.

2. Description of the Related Art

A conventional memory device includes an array of individual memory cells that are organized in rows and columns, a plurality of word lines interconnecting respectively the rows of memory cells at control gates of the latter, and a plurality of bit lines interconnecting respectively the columns of memory cells. During the manufacture of the memory device, short circuiting of adjacent word lines or adjacent bit lines may occur due to the presence of air particles. Open circuiting of individual word lines or bit lines may also occur due to improper etching process control. In either case, short circuiting or open circuiting of the word lines or bit lines will result in reading of incorrect data from the memory device.

In order to overcome this problem, defects in the memory device must be detected before packaging. Once identified, the defective word lines or bit lines will be permanently disabled and replaced by redundant word lines or bit lines.

Conventional memory devices are generally not provided with an on-chip manufacturing defect detection capability. Thus, word line short, word line open, bit line short and bit line open conditions are usually detected externally with the use of a tester, which is an expensive device. In addition, conventional testing is done serially, i.e. testing of a word line or bit line is done one at a time, thereby resulting in a time-intensive operation.

After line short and line open testing have been completed, the memory cells of the memory device are tested to see if they can be programmed and erased successfully. The conventional way of performing this test is to erase all the memory cells of the memory device, and check if the threshold voltage of each memory cell is below an erase verify voltage which is higher than the word line read voltage. Thereafter, all of the memory cells are programmed and checked to see if their threshold voltages are above a program verify voltage which is also higher than the word line read voltage. Of course, the definitions of the erase and program operations can be reversed as is known in the art. Once the defective memory cells have been detected, they will be replaced by the redundant memory cells.

The conventional memory cell testing method uses off-chip software to check the threshold voltages of the memory cells. However, this method requires full memory data to be read out in series, thereby increasing the testing time and cost.

SUMMARY OF THE INVENTION

The main object of the present invention is to provide a memory device with an on-chip manufacturing and memory cell defect detection capability to obviate the need for an external tester when detecting word line short, word line open, bit line short and bit line open manufacturing defects, as well as memory cell defects.

Another object of the present invention is to provide a memory device with an on-chip manufacturing defect detection capability, wherein testing includes a first level test, which is a global test to detect if there is a word line or bit line defect in the memory device, and a second level test, which is a local test to identify the defective word line or bit line.

Still another object of the present invention is to provide a memory device with an on-chip manufacturing defect detection capability, wherein the global and the local tests can be done in parallel, e.g. a plurality of word lines or bit lines are tested simultaneously, to reduce the testing time and minimize the operating costs.

According to one aspect of the invention, a memory device with an on-chip manufacturing defect detection capability comprises:

a memory array including a plurality of memory cells organized in rows and columns, a plurality of word lines interconnecting respectively the rows of memory cells, and a plurality of bit lines interconnecting respectively the columns of memory cells, one of the plurality of word lines and the plurality of bit lines being grouped into odd and even access lines, each of the even access lines being disposed between adjacent two of the odd access lines; and a global access line short testing circuit including
first means connected to the even access lines and activable in a testing mode to pull the even access lines to a first logic state;
second means connected to the odd access lines and activable in the testing mode to pull the odd access lines to a second logic state opposite to the first logic state; and
a global access line short detector connected to one of the first and second means and activable in the testing mode to generate an output signal when the even access lines are pulled to the second logic state or when the odd access lines are pulled to the first logic state due to a short circuit between one of the even access lines and one of the odd access lines.

According to another aspect of the invention, a memory device with an on-chip manufacturing defect detection capability comprises:

a memory array including a plurality of memory cells organized in rows and columns, and a plurality of access lines interconnecting respectively one of the rows and columns of memory cells;

a select circuit connected to the access lines at one side of the memory array and operable in a testing mode to pull the access lines to a first logic state; and a global access line open testing circuit including
precharging means connected to the access lines on another side of the memory array opposite to the select circuit and activable in the testing mode to pull the access lines to a second logic state opposite to the first logic state; and
a global access line open detector connected to the precharging means and activable in the testing mode to generate an output signal when any one of the access lines remains in the second logic state due to open circuiting of the same.

According to another aspect of the invention, a memory device with an on-chip manufacturing defect detection capability comprises:

a memory array including a plurality of memory cells organized in rows and columns, and a plurality of word lines interconnecting respectively the rows of memory cells;

a row select circuit connected to the word lines;

a first row pre-decoder connected to the row select circuit to group the word lines into a number of line blocks, the first row pre-decoder being capable of being disabled in a testing mode;

a second row pre-decoder connected to the row select circuit and operable in the testing mode so as to control the row select circuit to select one of the word lines of each of the line blocks at each time; and a local word line short testing circuit including a plurality of sense amplifiers connected respectively to the line blocks and activable in the testing mode to pull a corresponding one of the selected word lines to a first logic state and to generate an output signal upon detection that the corresponding one of the selected word lines is at a second logic state opposite to the first logic state due to short circuiting with an adjacent non-selected one of the word lines.

According to still another aspect of the invention, a memory device with an on-chip manufacturing defect detection capability comprises:

a memory array including a plurality of memory cells organized in rows and columns, and a plurality of word lines interconnecting respectively the rows of memory cells, the word lines being grouped into a plurality of odd lines and a plurality of even lines, each of the even lines being disposed between adjacent two of the odd lines;

a row select circuit connected to the word lines and operable in a testing mode so as to pull one of the plurality of odd lines and the plurality of even lines sequentially to a first logic state; and a local word line short testing circuit including
a plurality of transistors having source terminals, gate terminals connected respectively to the other one of the plurality of odd lines and the plurality of even lines not pulled by the row select circuit to the first logic state, and grounded drain terminals; and
a sense amplifier connected to the source terminals of the transistors and activable in the testing mode to pull the other one of the plurality of odd lines and the plurality of even lines to a second logic state opposite to the first logic state, and to generate an output signal upon detection that one of the word lines connected to the sense amplifier is pulled to the first logic state by one of the word lines pulled by the row select circuit due to short circuiting therewith.

According to a still another aspect of the invention, a memory device with an on-chip manufacturing defect detection capability comprises:

a memory array including a plurality of memory cells organized in rows and columns, and a plurality of word lines interconnecting respectively the rows of memory cells;

a row select circuit connected to the word lines at one side of the memory array;

a first row pre-decoder connected to the row select circuit to group the word lines into a number of line blocks, the first row pre-decoder being capable of being disabled in a testing mode;

a second row pre-decoder connected to the row select circuit and operable in the testing mode so as to control the row select circuit to select one of the word lines of each of the line blocks at each time; and a local word line open testing circuit including logic pulling means connected to the word lines at another side of the memory array opposite to the row select circuit and operable in the testing mode to pull the word lines to a first logic state; and a plurality of sense amplifiers connected respectively to the line blocks and activable in the testing mode to pull a corresponding one of the selected word lines to a second logic state opposite to the first logic state and to generate an output signal upon detection that the corresponding one of the selected word lines remains at the second logic state due to open circuiting of the same.

According to a further aspect of the invention, a memory device with an on-chip manufacturing defect detection capability comprises:

a memory array including a plurality of memory cells organized in rows and columns, and a plurality of word lines interconnecting respectively the rows of memory cells;

a row select circuit connected to the word lines at one side of the memory array and operable in a testing mode so as to pull the word lines sequentially to a first logic state; and a local word line open testing circuit including
precharging means connected to the word lines at another side of the memory array opposite to the row select circuit and activable in the testing mode to pull the word lines to a second logic state opposite to the first logic state; and
a sense amplifier connected to the precharging means and activable in the testing mode to generate an output signal upon detection that one of the word lines selected by the row select circuit remains in the second logic state due to open circuiting thereof.

According to a further aspect of the invention, a memory device with an on-chip manufacturing defect detection capability comprises:

a memory array including a plurality of memory cells organized in rows and columns, and a plurality of bit lines interconnecting respectively the columns of memory cells;

a column select circuit connected to the bit lines at one side of the memory array and provided with a number of output lines;

a column decoder connected to the column select circuit and operable so as to control the column select circuit to select a number of the bit lines for connection with the output lines;

a number of read sense amplifiers connected respectively to the output lines and being capable of being disabled in a testing mode; and a local bit line short testing circuit including
logic pulling means connected to one of odd and even ones of the bit lines at another side of the memory array opposite to the column select circuit and operable in the testing mode to pull the bit lines connected thereto to a first logic state; and
a plurality of sense amplifiers connected respectively to the output lines of the column select circuit and activable in the testing mode to pull a corresponding one of the bit lines selected by the column select circuit to a second logic state opposite to the first logic state and to generate an output signal upon detection that the corresponding one of the selected bit lines is at the first logic state due to short circuiting with an adjacent non-selected one of the bit lines.

According to a further aspect of the invention, a memory device with an on-chip manufacturing defect detection capability comprises:

- a memory array including a plurality of memory cells organized in rows and columns, and a plurality of bit lines interconnecting respectively the columns of memory cells;
- a column select circuit connected to the bit lines at one side of the memory array and provided with a number of output lines;
- a column decoder connected to the column select circuit and operable so as to control the column select circuit to select a number of the bit lines for connection with the output lines;
- a number of read sense amplifiers connected respectively to the output lines and being capable of being disabled in a testing mode; and
- a local bit line open testing circuit including
  - logic pulling means connected to the bit lines at another side of the memory array opposite to the column select circuit and operable in the testing mode to pull the bit lines to a first logic state; and
  - a plurality of sense amplifiers connected respectively to the output lines of the column select circuit and activable in the testing mode to pull a corresponding one of the bit lines selected by the column select circuit to a second logic state opposite to the first logic state and to generate an output signal upon detection that the corresponding one of the selected bit lines remains at the first logic state due to open circuiting thereof.

According to a further aspect of the invention, a memory device with an on-chip memory cell defect detection capability comprises:

- a memory array including a plurality of memory cells organized in rows and columns, a plurality of word lines interconnecting respectively the rows of memory cells, and a plurality of bit lines interconnecting respectively the columns of memory cells;
- row select means connected to the word lines and operable in a program mode for programming the memory cells, an erasing mode for erasing the memory cells, a program verify mode for applying a program verify voltage to a selected one of the word lines to verify programming of the memory cells on the selected one of the word lines, and an erase verify mode for applying an erase verify voltage to the selected one of the word lines to verify erasing of the memory cells on the selected one of the word lines; and
- a testing circuit connected to the bit lines for generating an output signal, upon detection that one of the bit lines remains in an unprogrammed or unerased logic state when the program verify or erase verify voltage is generated after a programming or erasing operation, to verify that at least one of the memory cells on the selected one of the word lines is defective.

According to a further aspect of the invention, a memory device with an on-chip memory cell threshold voltage detection capability comprises:

- a memory array including a plurality of memory cells organized in rows and columns, a plurality of word lines interconnecting respectively the rows of memory cells, and a plurality of bit lines interconnecting respectively the columns of memory cells;
- row select means connected to the word lines and operable in a testing mode for applying a varying word line voltage to a selected one of the word lines; and
- a testing circuit connected to the bit lines for generating an output signal upon detecting a change in logic state of at least one of the memory cells on the selected one of the word lines due to the varying word line voltage applied thereto.

According to a further aspect of the invention, a memory device with an on-chip manufacturing defect detection capability comprises:

- a memory array including a plurality of memory cells organized in rows and columns, a plurality of word lines interconnecting respectively the rows of the memory cells, and a plurality of bit lines interconnecting respectively the columns of the memory cells;
- first means connected to one of the plurality of word lines and the plurality of bit lines and activable in a testing mode to pull said one of the plurality of word lines and the plurality of bit lines to a first logic state;
- second means connected to the other one of the plurality of word lines and the plurality of bit lines and activable in a testing mode to pull the other one of the plurality of word lines and the plurality of bit lines to a second logic state opposite to the first logic state; and
- a testing circuit connected to one of the first and second means and activable in the testing mode to generate an output signal when said one of the plurality of word lines and the plurality of bit lines are pulled to the second logic state or when the other one of the plurality of word lines and the plurality of bit lines are pulled to the first logic state due to a short circuit between one of the word lines and one of the bit lines.

BRIEF DESCRIPTION OF THE DRAWINGS

Other features and advantages of the present invention will become apparent in the following detailed description of the preferred embodiments with reference to the accompanying drawings, of which:

FIG. 7A is a timing diagram illustrating a precharging pulse signal and an enable signal for the detector of FIG. 7;

FIG. 10A illustrates a detector for the embodiment of FIG. 10;

FIG. 10B illustrates another detector for the embodiment of FIG. 10;

DETAILED DESCRIPTION OF THE PREFERRED EMBODIMENTS

Figure 1:
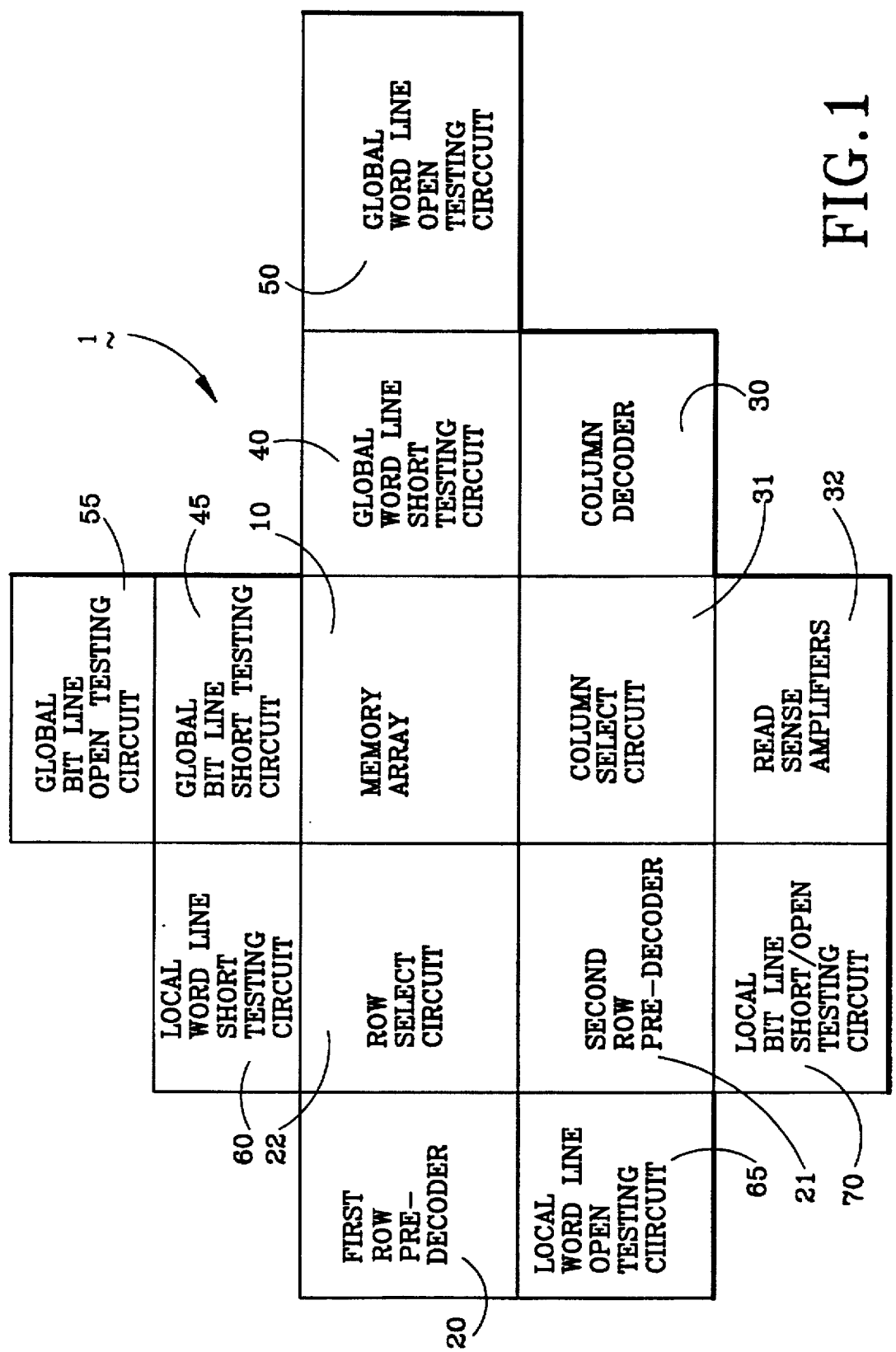
FIG. 1 is a block diagram of a memory device in which the various aspects of the present invention are implemented.

Before the present invention is described in greater detail, it should be noted that like elements are denoted by the same reference numerals throughout the disclosure.

Referring to FIG. 1, the preferred embodiment of a memory device 1 according to the present invention is shown to comprise a conventional memory array 10 including a plurality of individual memory cells organized in rows and columns, a plurality of word lines interconnecting respectively the rows of memory cells, and a plurality bit lines interconnecting respectively the columns of memory cells. The memory cells may be any type of memory cell, such as ROM, RAM, PROM, EPROM, EEPROM, FLASH, etc. The memory device 1 further comprises first and second row pre-decoders 20, 21 connected to the word lines via a row select circuit 22, a column decoder 30 and read sense amplifiers 32 connected to the bit lines via a column select circuit 31, a global word line short testing circuit 40, a global bit line short testing circuit 45, a global word line open testing circuit 50, a global bit line open testing circuit 55, a local word line short testing circuit 60, a local word line open testing circuit 65, and a local bit line short/open testing circuit 70.

Figure 2:
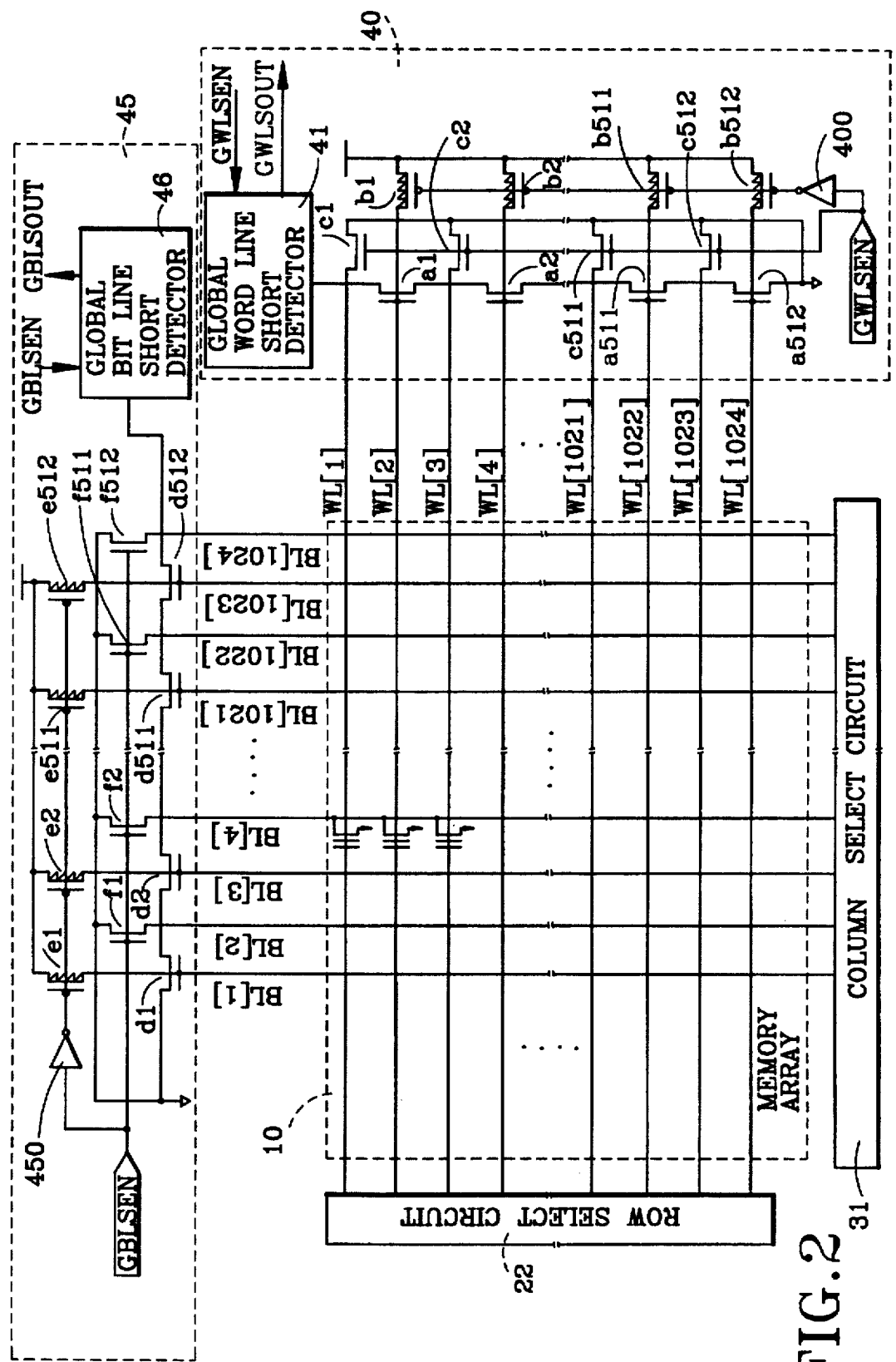
FIG. 2 illustrates how global testing for word line and bit line short defects are performed in accordance with the present invention.

FIG. 2 illustrates the connection among the memory array 10, the row select circuit 22, the column select circuit 31, the global word line short testing circuit 40 and the global bit line short testing circuit 45. As shown, the global word line short testing circuit 40 is disposed on one side of the memory array 10 opposite to the row select circuit 22, while the global bit line short testing circuit 45 is disposed on one side of the memory array 10 opposite to the column select circuit 31. In this example, the memory array 10 has 1024 word lines and 1024 bit lines.

The global word line short testing circuit 40 includes a plurality of first transistors a1-a512, a plurality of second transistors b1-b512, a plurality of third transistors c1-c512, and a global word line short detector 41.

The first transistors a1-a512 are connected in series and have gate terminals connected respectively to even ones of the word lines. The first transistor a1 connected to a first one of the even word lines has a source terminal connected to the detector 41. The first transistor a512 connected to a last one of the even word lines has a grounded drain terminal. The second transistors b1-b512 have source terminals connected to a voltage source, drain terminals connected respectively to even ones of the word lines, and gate terminals which receive an enable signal GWLSEN through an inverter 400 during a global word line short testing mode. In this embodiment, the second transistors b1-b512 are formed as medium-channel transistors having small drain-source currents. As such, the first and second transistors a1-a512, b1-b512 cooperate to pull the even word lines to a weak high logic state during the global word line short testing mode.

The third transistors c1-c512 have source terminals connected respectively to odd ones of the word lines, grounded drain terminals, and gate terminals which receive the enable signal GWLSEN. The third transistors c1-c512 pull the odd word lines to a low logic state during the global word line short testing mode.

Figure 3:
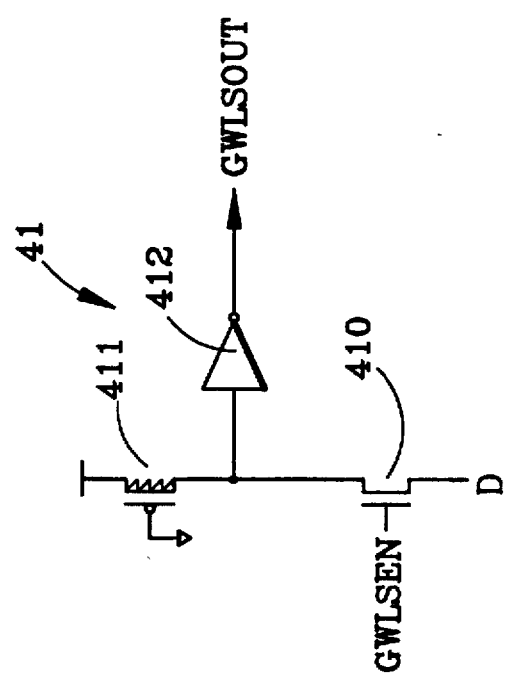
FIG. 3 illustrates a detector used in the circuit of FIG. 2.

The global word line short detector 41 receives the enable signal GWLSEN and generates an output signal GWLSOUT indicative of a short circuit occurring between one of the odd word lines and one of the even word lines. FIG. 3 illustrates a preferred implementation of the detector 41. As shown, the detector 41 is implemented as a static sense amplifier which includes a switching transistor 410, a pull-up transistor 411 and an inverter 412. The pull-up transistor 411 is formed as a medium-channel transistor which interconnects a source terminal of the switching transistor 410 and a voltage source. The switching transistor 410 has a drain terminal connected to the source terminal of the first transistor a1, and a gate terminal which receives the enable signal GWLSEN. The inverter 412 has an input end connected to the source terminal of the switching transistor 410, and an output end where the output signal GWLSOUT can be obtained.

Referring to FIGS. 2 and 3, in operation, when the enable signal GWLSEN is generated, the second transistors b1-b512 are turned on to pull the even word lines to a weak high logic state, whereas the third transistors c1-c512 are turned on to pull the odd word lines to a low logic state. If none of the word lines is short circuited, the drain terminal of the switching transistor 410 is pulled to the low logic state, and the output signal GWLSOUT from the inverter 412 is at the high logic state to indicate that none of the word lines is short circuited. However, if one of the even word lines is short circuited to an adjacent one of the odd word lines, the short circuited even word line will be pulled to the low logic state in spite of the presence of the corresponding second transistor b1-b512. As such, the drain terminal of the switching transistor 410 is pulled to the high logic state, and the output signal GWLSOUT from the inverter 412 is at the low logic state to indicate the presence of a word line short condition.

Referring again to FIG. 2, the global bit line short testing circuit 45 includes a plurality of first transistors d1-d512, a plurality of second transistors e1-e512, a plurality of third transistors f1-f512, and a global bit line short detector 46.

The first transistors d1-d512 are connected in series and have gate terminals connected respectively to odd ones of the bit lines. The first transistor d512 connected to a last one of the odd bit lines has a source terminal connected to the detector 46. The first transistor d1 connected to a first one of the odd bit lines has a grounded drain terminal. The second transistors e1-e512 have source terminals connected to a voltage source, drain terminals connected respectively to odd ones of the bit lines, and gate terminals which receive an enable signal GBLSEN through an inverter 450 during a global bit line short testing mode. In this embodiment, the second transistors e1–e512 are formed as medium-channel transistors having small drain-source currents. As such, the first and second transistors d1–d512, e1–e512 cooperate to pull the odd bit lines to a weak high logic state during the global bit line short testing mode.

The third transistors f1–f512 have source terminals connected respectively to even ones of the bit lines, grounded drain terminals, and gate terminals which receive the enable signal GBLSEN. The third transistors f1–f512 pull the even bit lines to a low logic state during the global bit line short testing mode.

The global bit line short detector 46 receives the enable signal GBLSEN and generates an output signal GBLSOUT indicative of a short circuit occurring between one of the odd bit lines and one of the even bit lines. The detector 46 is similar to the detector 41 shown in FIG. 3, except that the switching transistor of the detector 46 receives the enable signal GBLSEN, and that the output signal GBLSOUT can be obtained from the inverter of the detector 46.

In operation, when the enable signal GBLSEN is generated, the second transistors e1–e512 are turned on to pull the odd bit lines to a weak high logic state, whereas the third transistors f1–f512 are turned on to pull the even bit lines to a low logic state. If none of the bit lines is short circuited, the output signal GBLSOUT is at the high logic state to indicate that none of the bit lines is short circuited. However, if one of the odd bit lines is short circuited to an adjacent one of the even bit lines, the short circuited odd bit line will be pulled to the low logic state in spite of the presence of the corresponding second transistor e1–e512. As such, the output signal GBLSOUT is at the low logic state to indicate the presence of a bit line short condition.

It should be noted that the testing circuit 40 may be modified to operate in a manner similar to the operation of the testing circuit 45, i.e. the odd word lines are pulled to the weak high logic state while the even word lines are pulled to the low logic state during the global word line short testing mode. Moreover, the testing circuit 45 may be modified to operate in a manner similar to the operation of the testing circuit 40, i.e. the odd bit lines are pulled to the low logic state while the even bit lines are pulled to the weak high logic state during the global bit line short testing mode.

To speed up the response times of the detectors 41, 46, the first transistors a1–a512, d1–d512 of the testing circuits 40, 45 may be arranged into several groups such that each group can be provided with its own global line short detector 41, 46.

Figure 4:
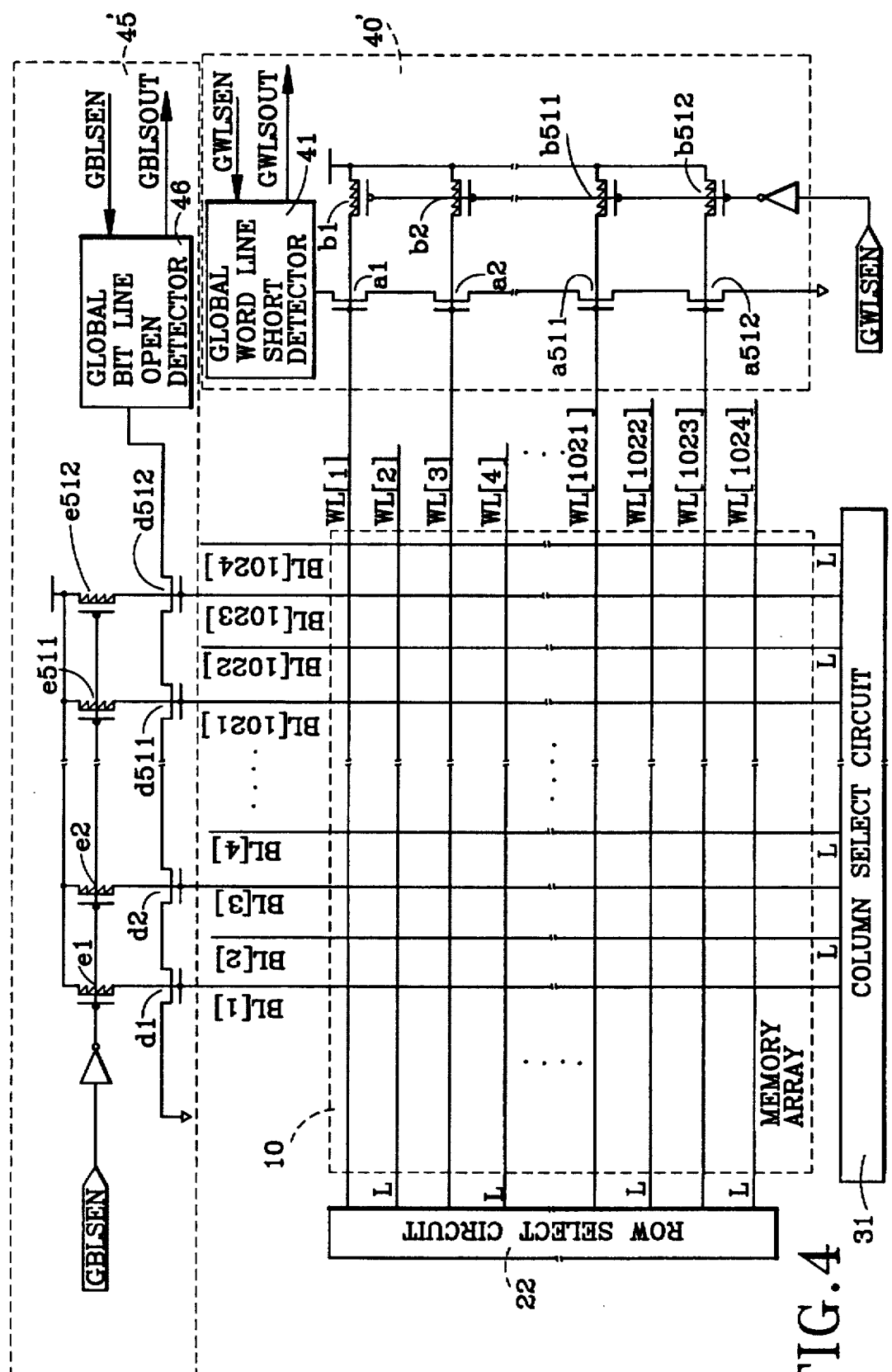
FIG. 4 illustrates modified global word line and bit line short testing circuits according to the present invention.

FIG. 4 illustrates modified embodiments of the global word line and bit line short testing circuits of this invention. As shown, the testing circuits 40', 45' are not provided with the third transistors c1–c512, f1–f512 used in the previous embodiment. Instead, the testing circuit 40' relies on the row select circuit 22 to pull the even word lines to the low logic state during the global word line short testing mode, while the testing circuit 45' relies on the column select circuit 31 to pull the even bit lines to the low logic state during the global bit line short testing mode. The operation of the embodiment of FIG. 4 is generally similar to that of the previous embodiment and will not be detailed hereinafter.

Figure 5:
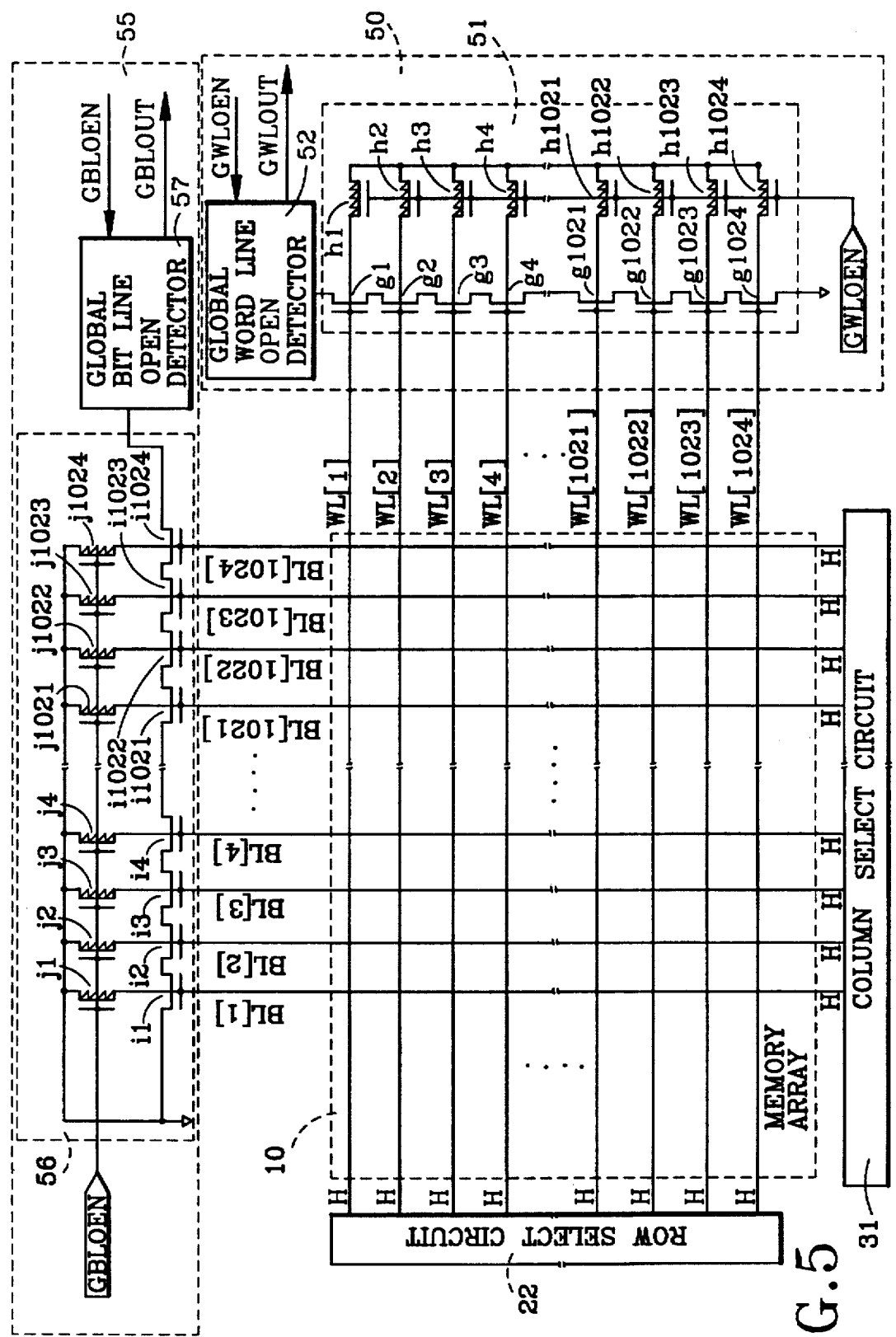
FIG. 5 illustrates how global testing for word line and bit line open defects are performed in accordance with the present invention.

FIG. 5 illustrates the connection among the memory array 10, the row select circuit 22, the column select circuit 31, the global word line open testing circuit 50, and the global bit line open testing circuit 55. As shown, the global word line open testing circuit 50 is disposed on one side of the memory array 10 opposite to the row select circuit 22, while the global bit line open testing circuit 55 is disposed on one side of the memory array 10 opposite to the column select circuit 31.

The global word line open testing circuit 50 comprises a precharging device 51 and a global word line open detector 52 connected to the precharging device 51.

The precharging device 51 includes a plurality of first transistors g1–g1024 and a plurality of second transistors h1–h1024. The first transistors g1–g1024 are connected in series and have gate terminals connected respectively to the word lines. The first transistor g1 connected to a first one of the word lines has a source terminal connected to the detector 52. The first transistor g1024 connected to a last one of the word lines has a grounded drain terminal. The second transistors h1–h1024, which are formed as medium-channel transistors, have grounded drain terminals, source terminals connected respectively to the word lines, and gate terminals that receive an enable signal GWLOEN in the global word line open testing mode. As such, the precharging device 51 can be activated to pull the word lines to a weak low logic state in the global word line open testing mode.

The detector 52 is similar to the detector 41 shown in FIG. 3, the main difference residing in that the switching transistor of the detector 52 receives the enable signal GWLOEN in the global word line open testing mode, and that the output signal GWLOUT is obtained from the inverter of the detector 52.

In operation, when the enable signal GWLOEN is generated, the precharging device 51 pulls the word lines to a weak low logic state. Thereafter, the row select circuit 22 pulls the word lines to a high logic state. If none of the word lines is open circuited, all of the word lines are at the high logic state such that the output signal GWLOUT generated by the detector 52 is at the high logic state. However, if one of the word lines is open circuited, the open circuited word line will remain in the low logic state. As such, the output signal GWLOUT from the detector 52 will be at the low logic state to indicate the presence of a word line open condition.

The global bit line open testing circuit 55 comprises a precharging device 56 and a global bit line open detector 57 connected to the precharging device 56.

The precharging device 56 is similar to the precharging device 51 of the testing circuit 50 and comprises a plurality of interconnected first transistors i1–i1024 that are connected respectively to the bit lines, and a plurality of second transistors j1–j1024 formed as medium-channel transistors that are also connected respectively to the bit lines and that receive an enable signal GBLOEN in the global bit line open testing mode. Thus, the precharging device 56 can be activated to pull the bit lines to a weak low logic state in the global bit line open testing mode.

The detector 57 is similar to the detector 41 shown in FIG. 3, the main difference residing in that the switching transistor of the detector 57 receives the enable signal GBLOEN in the global bit line open testing mode, and that the output signal GBLOUT is obtained from the inverter of the detector 57.

In operation, when the enable signal GBLOEN is generated, the precharging device 56 pulls the bit lines to a weak low logic state. Thereafter, the column select circuit 31 pulls the bit lines to a high logic state. If none of the bit lines is open circuited, all of the bit lines are at the high logic state such that the output signal GBLOUT generated by the detector 57 is at the high logic state. However, if one of the bit lines is open circuited, the open circuited bit line will remain in the low logic state. As such, the output signal GBLOUT will be at the low logic state to indicate the presence of a bit line open condition.

Like the previous embodiments, the first transistors g1–g512, i1–i512 of the precharging devices 51, 56 may be arranged into several groups such that each group can be associated operably with a corresponding global line open detector 52, 57, thereby speeding up the response times of the detectors 52, 57.

The global bit line open testing circuit 55 can also be used to detect if all of the memory cells on a selected word line can be successfully programmed. After programming the memory cells, the row select circuit 22 applies a program verify voltage to the selected word line. If all of the memory cells on the selected word line were successfully programmed, all of the bit lines will be pulled to the low logic state, and the testing circuit 55 does not generate an output at this time. If the threshold voltage of one of the memory cells is higher than the program verify voltage, the corresponding bit line will be pulled high, and the testing circuit 55 will generate an output to indicate the presence of a defective memory cell.

The global bit line open testing circuit 55 can further be used to detect the minimum threshold voltage of a selected word line. Detection is accomplished by controlling the row select circuit 22 to ramp gradually or stepwise the word line voltage from low to high until any of the memory cells is turned on, or from high to low until all of the memory cells are turned off.

Figure 6:
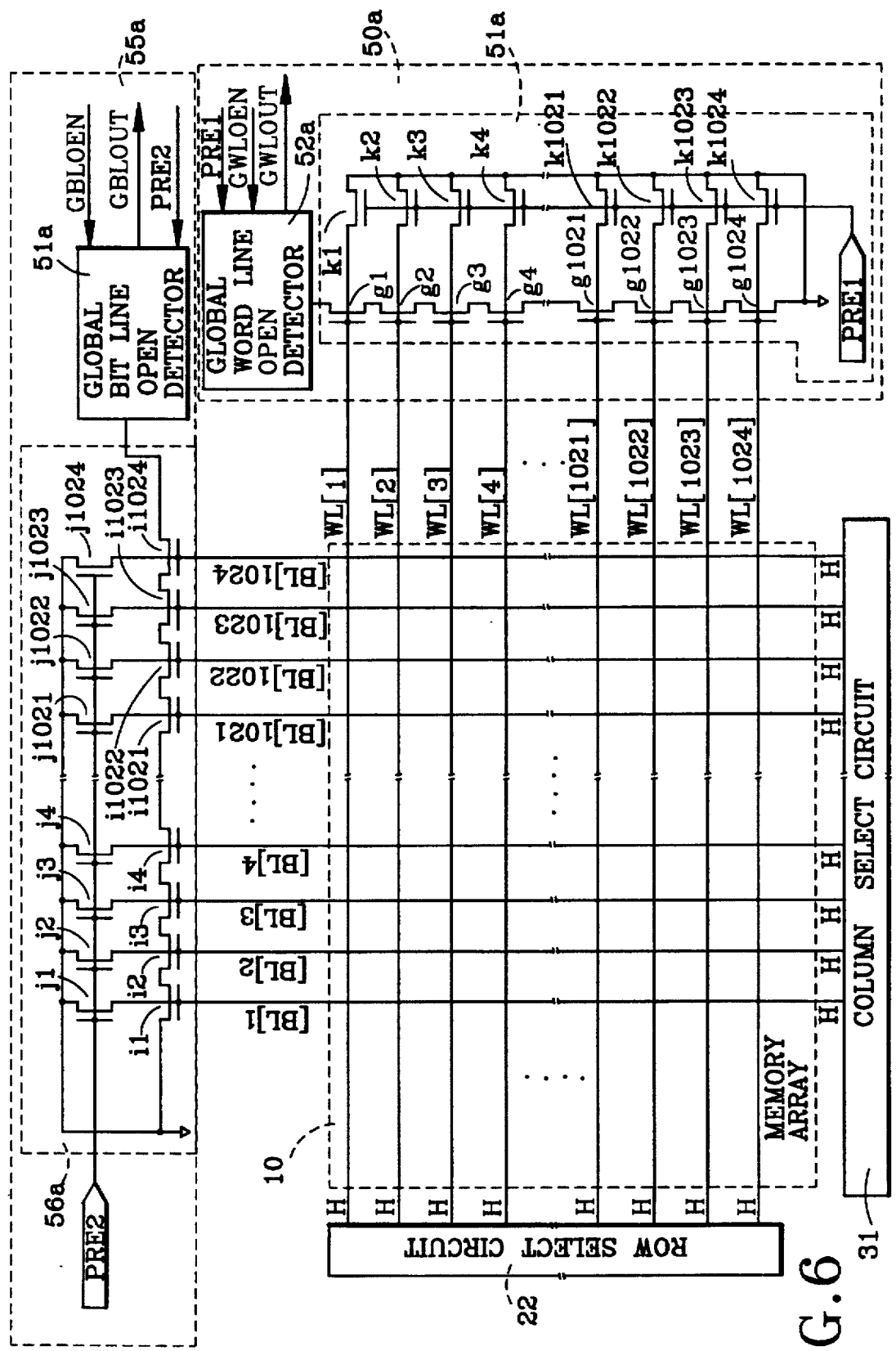
FIG. 6 illustrates modified global word line and bit line open testing circuits according to the present invention.

FIG. 6 illustrates modified embodiments of the global word line and bit line open testing circuits of this invention. Unlike the embodiments of FIG. 5, which employ static precharging devices 51, 56 and static detectors 52, 57 that use medium-channel transistors, the testing circuits 50a, 55a employ dynamic precharging devices 51a, 56a and dynamic detectors 52a, 57a, which do not use medium-channel transistors, for better size control. As shown, the second transistors k1–k1024, l1–l1024 are formed as ordinary transistors having grounded drain terminals, source terminals connected respectively to the word and bit lines, and gate terminals which receive an enable signal in the form of a precharging pulse signal PRE1, PRE2 during the corresponding global line open testing mode.

Figure 7:
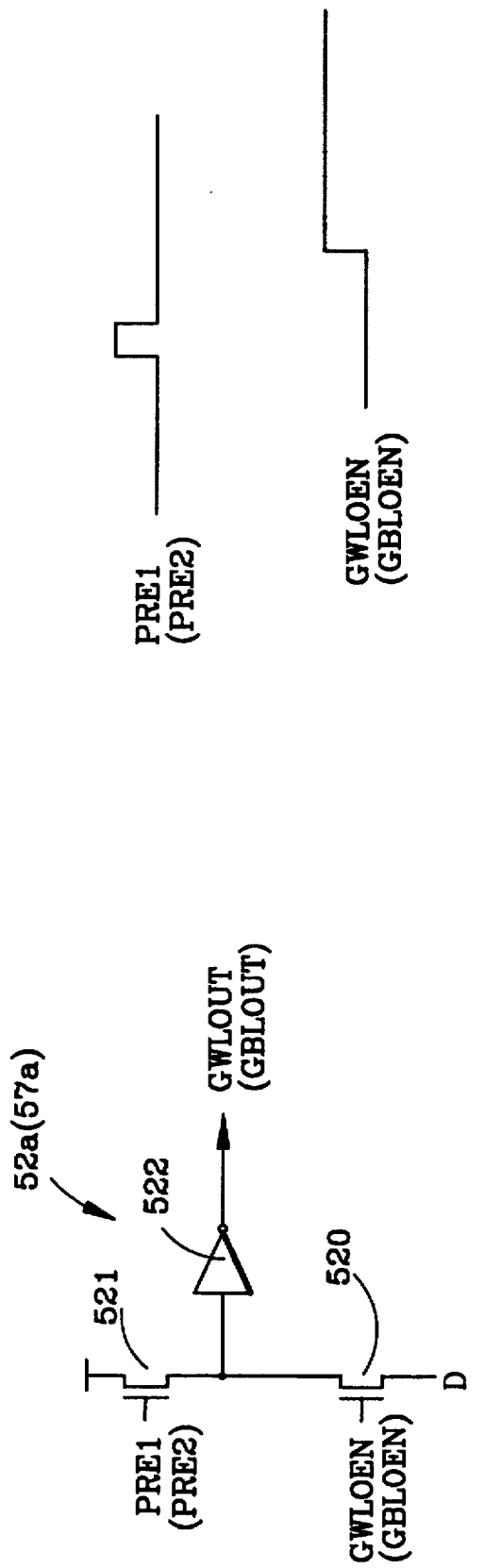
FIG. 7 illustrates a detector used in the testing circuits of FIG. 6.

Referring to FIG. 7, the detectors 52a, 57a comprise a switching transistor 520, a pull-up transistor 521 and an inverter 522. The switching transistor 520 has a source terminal with the inverter 522 connected thereto, a gate terminal which receives an enable signal GWLOEN, GBLOEN in the corresponding global line open testing mode, and a drain terminal connected to the corresponding precharging device 51a, 56a. The output signal GWLOUT, GBLOUT is obtained from the inverter 522. The pull-up transistor 521 has a gate terminal that receives the precharging pulse signal PRE1, PRE2 in the corresponding global line open testing mode, and interconnects the source terminal of the switching transistor 520 and a voltage source. As shown in FIG. 7A, the enable signal GWLOEN, GBLOEN is generated after a lagging edge of the precharging pulse signal PRE1, PRE2.

When conducting a global word line open test, the precharging pulse signal PRE1 is initially generated to pull the word lines to the weak low logic state. Thereafter, the row select circuit 22 pulls the word lines to a high logic state. If none of the word lines is open circuited, all of the word lines are at the high logic state such that the output signal GWLOUT generated by the detector 52a is at the high logic state. However, if one of the word lines is open circuited, the open circuited word line will remain in the low logic state. As such, the output signal GWLOUT will be at the low logic state to indicate the presence of a word line open condition. The operation for the global bit line open test for the circuit of FIG. 6 is generally similar to that for the global word line open test and will not be described further.

Figure 8:
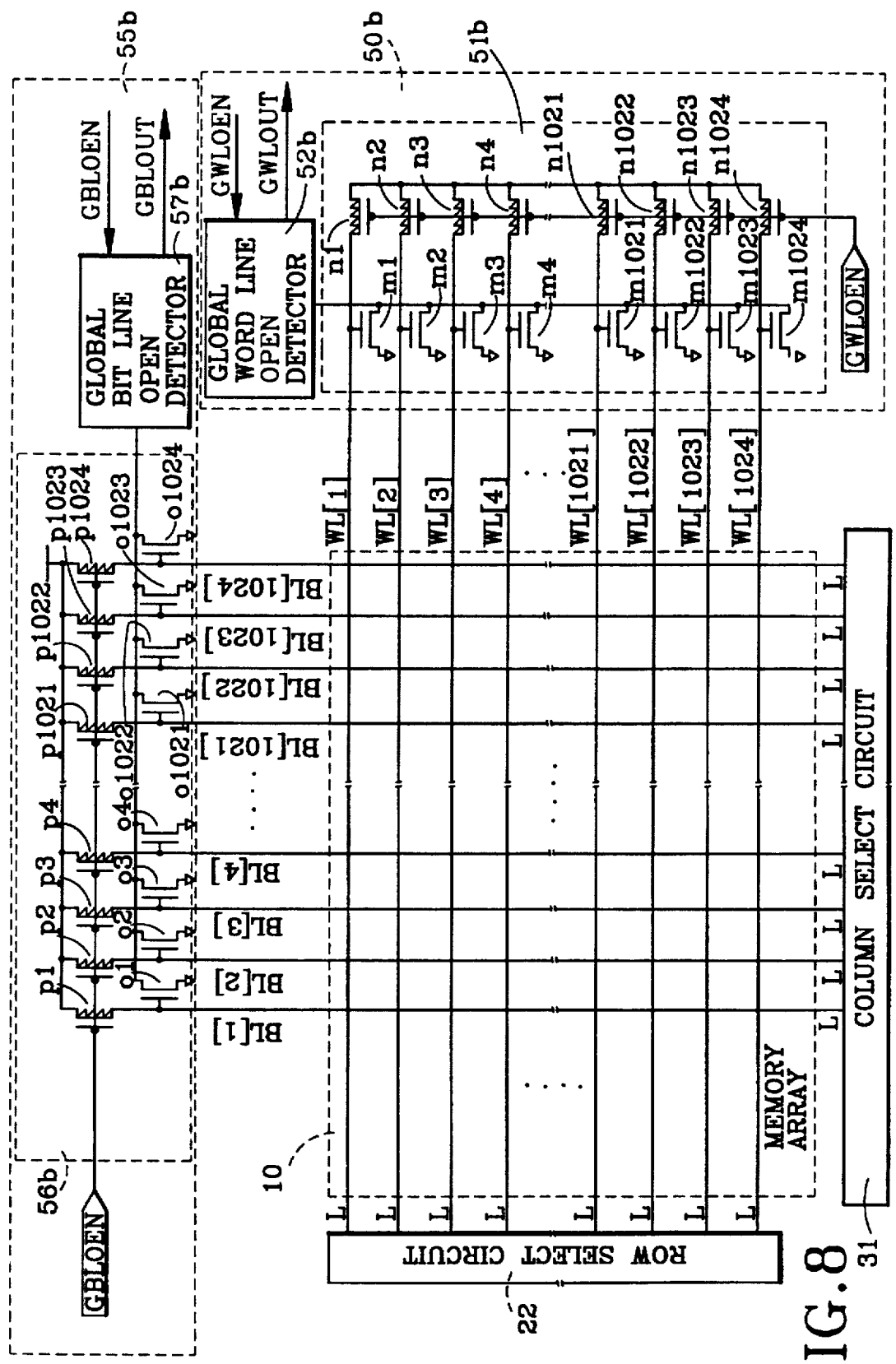
FIG. 8 illustrates other embodiments of global word line and bit line open testing circuits according to the present invention.

FIG. 8 illustrates other preferred embodiments of the global word line and bit line open testing circuits 50b, 55b of this invention. As shown, the testing circuits 50b, 55b comprise a static precharging device 51b, 56b connected to the word lines or bit lines opposite to the row or column select circuit 22, 31, and a static global line open detector 52b, 57b connected to the precharging device 51b, 56b.

The precharging device 51b comprises a plurality of first transistors m1–m1024 and a plurality of second transistors n1–n1024. The first transistors m1–m1024 have gate terminals connected respectively to the word lines, source terminals connected to the detector 52b, and grounded drain terminals. The second transistors n1–n1024, which are formed as medium-channel transistors, have source terminals connected to a voltage source, drain terminals connected respectively to the word lines, and gate terminals which receive an enable signal GWLOEN in the global word line open testing mode. The precharging device 51b can be activated to pull the word lines to a weak high logic state in the global word line open testing mode.

In operation, when the enable signal GWLOEN is generated, the precharging device 51b pulls the word lines to a weak high logic state. Thereafter, the row select circuit 22 pulls the word lines to a low logic state. If none of the word lines is open circuited, all of the word lines are at the low logic state such that the output signal GWLOUT generated by the detector 52b is at the low logic state. However, if one of the word lines is open circuited, the open circuited word line will remain in the high logic state. As such, the output signal GWLOUT will be at the high logic state to indicate the presence of a word line open condition.

The detector 41 of FIG. 3 is modified to result in the detector 52b which permits generation of the output signal GWLOUT when any of the word lines remains in the high logic state instead of the other way around as taught in the embodiment of FIG. 5. Such a modification can be readily achieved by a skilled artisan and will not be detailed hereinafter.

Since the structure and operation of the precharging device 56b, which comprises a plurality of first transistors o1–o1024 and a plurality of second transistors p1–p1024, and the detector 57b of the global bit line open testing circuit 55b are similar to those of the testing circuit 50b, a detailed description of the same will be dispensed with herein.

The global bit line open testing circuit 55b can also be used to detect if all of the memory cells on a selected word line can be successfully erased. After erasing the memory cells, the row select circuit 22 applies an erase verify voltage to the selected word line. If all of the memory cells on the selected word line were successfully programmed, all of the bit lines will be pulled to the low logic state, and the testing circuit 55b does not generate an output at this time. If the threshold voltage of one of the memory cells is higher than the erase verify voltage, the corresponding bit line will be pulled high, and the testing circuit 55b will generate an output to indicate the presence of a defective memory cell.

The global bit line open testing circuit 55 can further be used to detect the maximum threshold voltage of a selected word line. Detection is accomplished by controlling the row select circuit 22 to ramp gradually or stepwise the word line voltage from the low logic state to the high logic state until all of the memory cells are turned on, or from the high logic state to the low logic state until one of the memory cells is turned off.

Detection of the maximum and minimum threshold voltages of memory cells is particularly useful in non-volatile memories since data storage therein are related to the change in the threshold voltages of the memory cells. The applied word line voltages should not be limited to those in the positive range since negative word line voltages can also be used in some particular applications, such as in Flash memories.

Figure 9:
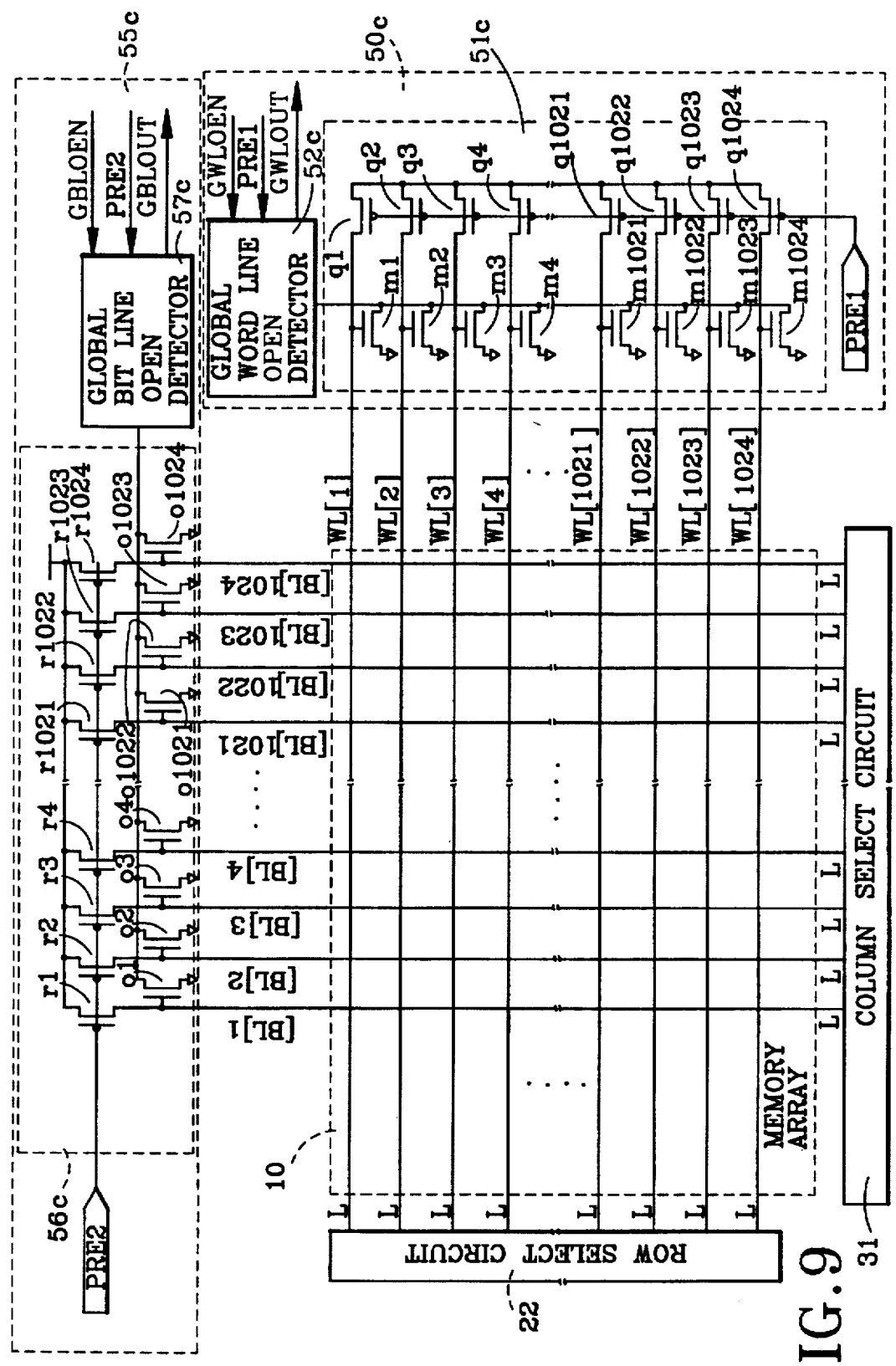
FIG. 9 illustrates still other embodiments of global word line and bit line open testing circuits according to the present invention.

FIG. 9 illustrates still other preferred embodiments of the global word line and bit line open testing circuits 50c, 55c of this invention. Unlike the embodiment of FIG. 8, the testing circuits 50c, 55c employ dynamic precharging devices 51c, 56c and dynamic detectors 52c, 57c similar to those found in the embodiment of FIG. 6. As shown in FIG. 9, the second transistors q1–q1024, r1–r1024 are formed as ordinary transistors having source terminals connected to a voltage source, drain terminals connected respectively to the word or bit lines, and gate terminals which receive an enable signal in the form of a precharging pulse signal PRE1, PRE2 during the corresponding global line open testing mode. Like the preceding embodiment, the precharging devices 51c, 56c can be activated to pull the word lines or the bit lines to a weak high logic state in the corresponding global line open testing mode. The detectors 52a, 57a found in FIG. 7 are modified to obtain the detectors 52c, 57c which operate in such a manner that the output signal GWLOUT, GBLOUT is at the low logic state if all of the word or bit lines can be pulled to the low logic state by the corresponding one of the row and column select circuits 22, 31, and that the output signal GWLOUT, GBLOUT is at the high logic state if any of the word or bit lines remains in the high logic state to indicate the presence of a line open condition.

Figure 10:
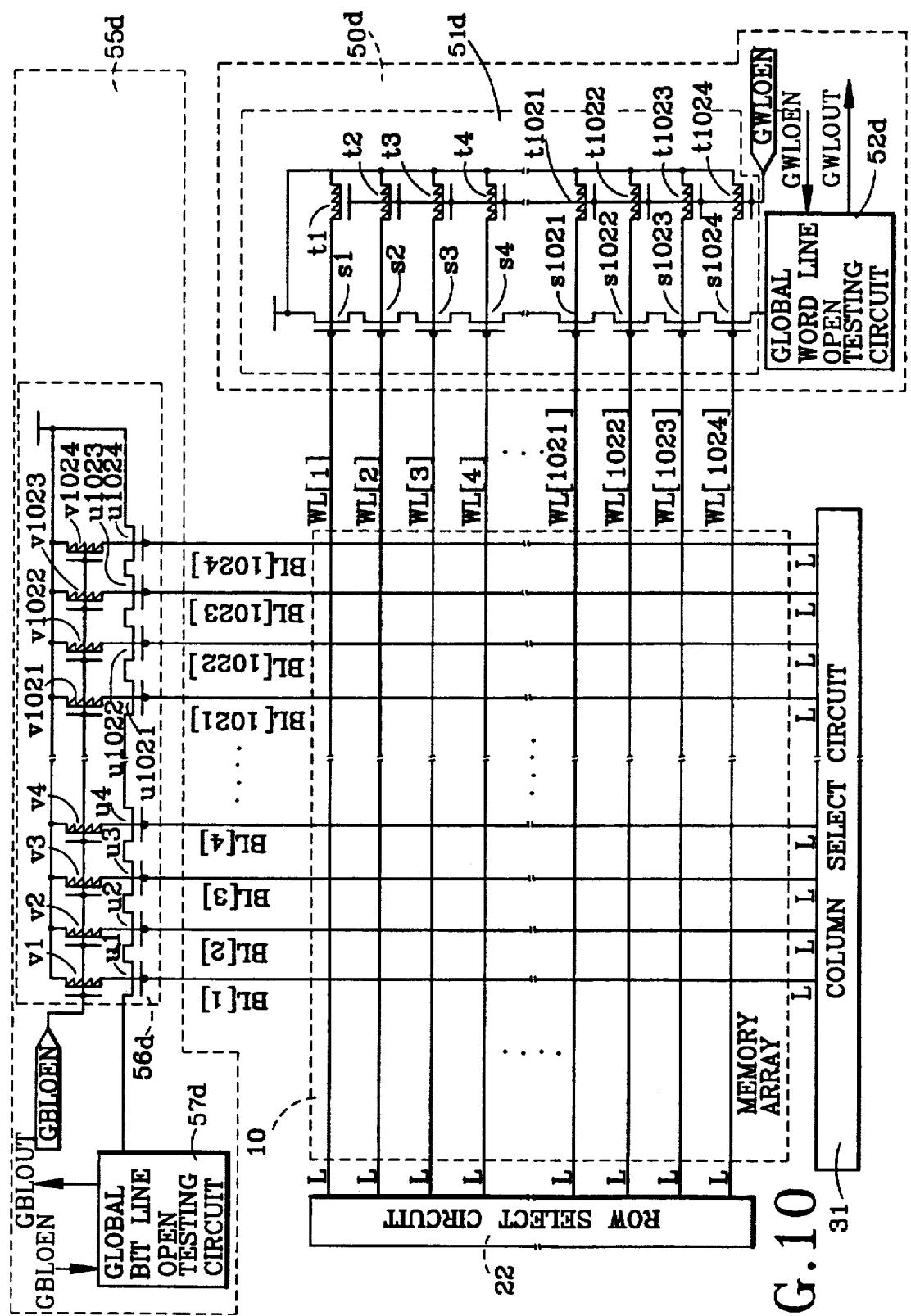
FIG. 10 illustrates further embodiments of global word line and bit line open testing circuits according to the present invention.
Figure 10:
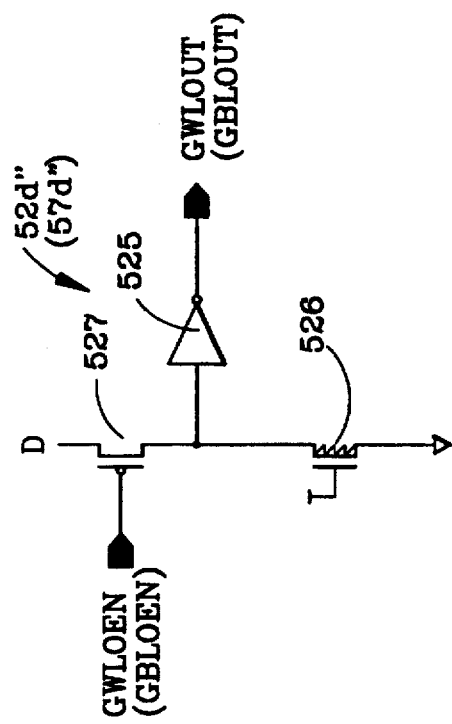
Figure 10:
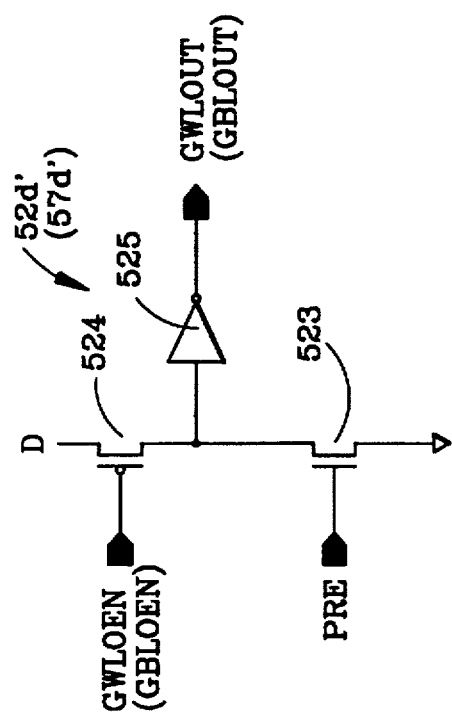

FIG. 10 illustrates further embodiments of the global word line and bit line open testing circuits 50d, 55d of this invention. Unlike the embodiment of FIG. 5, where the first transistors g1–g1024, i1–i1024 of the testing circuits 50, 55 are NMOS transistors, the first transistors s1–s1024, u1–u1024 are PMOS transistors. The first transistors s1–s1024, u1–u1024 of the precharging devices 51d, 56d are connected in series and have gate terminals connected respectively to the word or bit lines. The second transistors t1–t1024, v1–v1024, which are formed as medium-channel transistors, have source terminals connected to the voltage source, drain terminals connected respectively to the word or bit lines, and gate terminals that receive an enable signal GWLOEN, GBLOEN in the global line open testing mode. As such, the precharging devices 51d, 56d can be activated to pull the word lines and the bit lines to a weak high logic state in the global line open testing mode. Moreover, like the embodiment of FIG. 9, the detectors 52d, 57d are configured so that the output signal GWLOUT, GBLOUT is at the low logic state if all of the word and bit lines can be pulled to the low logic state by the corresponding one of the row and column select circuits 22, 31, and so that the output signal GWLOUT, GBLOUT is at the high logic state if any of the word and bit lines remains in the high logic state to indicate the presence of a line open condition.

FIGS. 10A and 10B illustrate examples of detectors for the embodiment of FIG. 10.

As shown in FIG. 10A, the detectors 52d', 57d' comprise a pull-down transistor 523, a switching transistor 524 and an inverter 525. The switching transistor 524 has a drain terminal with the inverter 525 connected thereto, a gate terminal which receives an enable signal GWLOEN, GBLOEN in the corresponding global line open testing mode, and a source terminal connected to the corresponding precharging device 51d, 56d. The output signal GWLOUT, GBLOUT is obtained from the inverter 525. The pull-down transistor 523 has a gate terminal that receives the precharging pulse signal PRE in the corresponding global line open testing mode, and interconnects the drain terminal of the switching transistor 524 and a ground terminal.

As shown in FIG. 10B, the detectors 52d", 57d" comprise a pull-down transistor 526, a switching transistor 527 and an inverter 528. The switching transistor 527 has a drain terminal with the inverter 528 connected thereto, a gate terminal which receives an enable signal GWLOEN, GBLOEN in the corresponding global line open testing mode, and a source terminal connected to the corresponding precharging device 51d, 56d. The output signal GWLOUT, GBLOUT is obtained from the inverter 528. The pull-down transistor 523, which is formed as a medium-channel transistor, has a gate terminal that is connected to a voltage source, and interconnects the drain terminal of the switching transistor 527 and a ground terminal.

As mentioned beforehand, the line short and line open testing functions of the memory device 1 of this invention involve two levels. The first level is a global test to detect if there exists any short or open defects in the word lines or bit lines of the memory device 1. The second level is a local test to detect the address of the defective word lines or bit lines.

Figure 11:
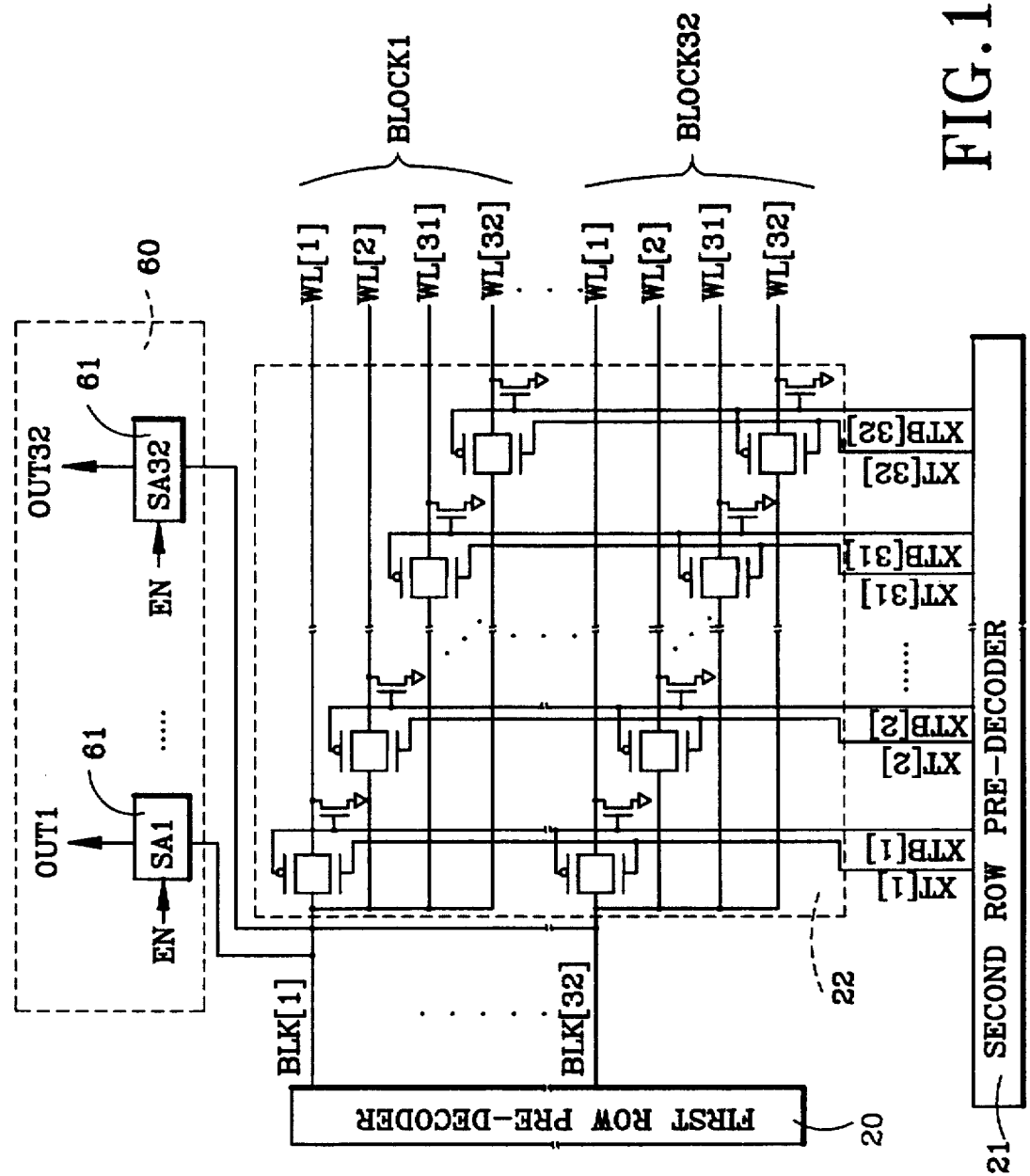
FIG. 11 illustrates how local testing for word line short defects are performed in accordance with the present invention.

FIG. 11 illustrates a preferred embodiment of the local word line short testing circuit 60 of this invention. As shown, the first row pre-decoder 20 is connected to the row select circuit 22 to group the word lines into a number of line blocks. In this embodiment, there are thirty-two line blocks, each of which includes thirty-two word lines. The second row pre-decoder 21 is connected to the row select circuit 22 and is operable in the local word line short testing mode so as to control the row select circuit 22 to select one of the word lines of each of the line blocks at each time. The local word line short testing circuit 60 includes a plurality of sense amplifiers 61 connected respectively to the line blocks. The sense amplifiers 61 are preferably similar in construction to either the detector 41 shown in FIG. 3, or the detectors 52a, 57a shown in FIG. 7.

In operation, the sense amplifiers 61 are simultaneously enabled upon receipt of the enable signal EN whereas the first row pre-decoder 20 is disabled in the local word line short testing mode, thereby floating the output lines BLK [1]–BLK[32] of the first row pre-decoder 20. The second row pre-decoder 21 controls the row select circuit 22 to select the word lines in each line block sequentially. The sense amplifiers 61 pull a corresponding one of the selected word lines to a high logic state and generate an output signal OUT1–OUT32 when the corresponding one of the selected word lines is at a low logic state due to short circuiting with an adjacent non-selected one of the word lines.

The operation of the local word line short testing circuit 60 is generally the same regardless of whether the sense amplifiers 61 are similar in construction to the detector 41 shown in FIG. 3, or the detectors 52a, 57a shown in FIG. 7. However, if the sense amplifiers 61 are constructed so as to be similar to the detectors 52a, 57a, it should be noted that the steps of generating the precharging signal PRE and the enable signal EN must be repeated before the second row pre-decoder 21 controls the row select circuit 22 to select a succeeding one of the word lines.

The embodiment of FIG. 11 employs parallel testing of the word lines to detect shorted ones of the word lines in a minimum amount of time. Of course, local word line short testing can also be done in a serial manner, albeit at a longer testing time.

Figure 12:
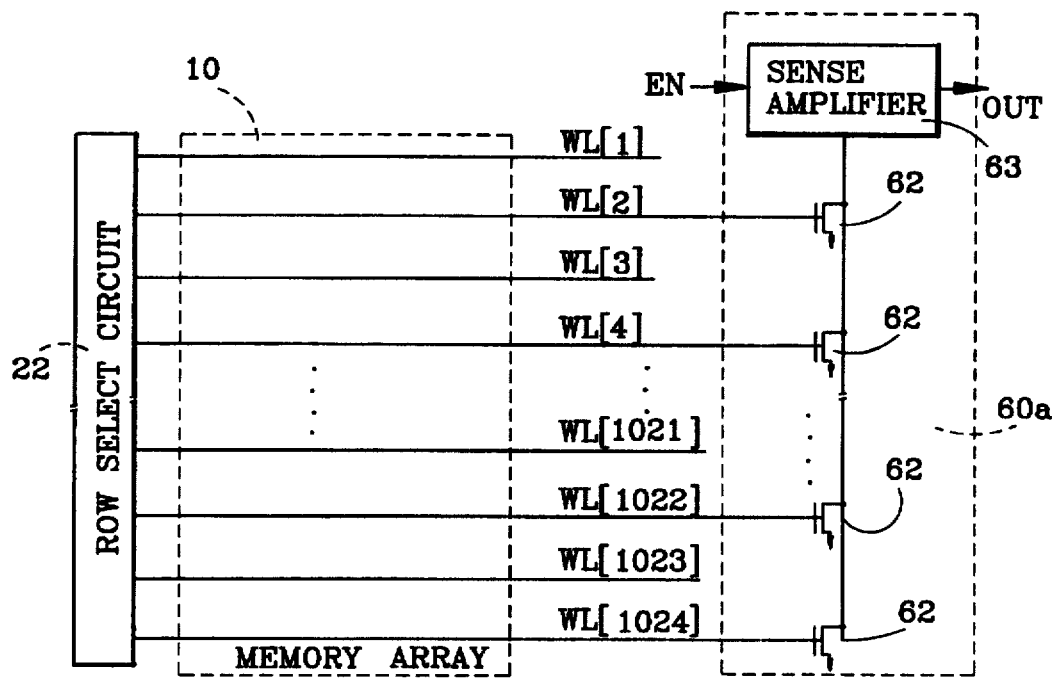
FIG. 12 illustrates a modified embodiment of a local word line short testing circuit according to the present invention.

FIG. 12 illustrates a modified embodiment of the local word line short testing circuit 60a which employs serial testing of the word lines. As shown, the testing circuit 60a comprises a plurality of transistors 62, each of which has a source terminal, a gate terminal connected to one of the even word lines, and a grounded drain terminal, and a sense amplifier 63 connected to the source terminals of the transistors 62.

During a local word line short testing operation, the row select circuit 22 pulls the odd word lines sequentially to a high logic state, whereas the sense amplifier 63 is enabled to pull the even word lines to a weak low logic state. The sense amplifier 63 generates a high output signal OUT when the even word line selected by the row select circuit 22 is pulled to the high logic state by an adjacent one of the odd word lines due to short circuiting therewith.

Figure 13:
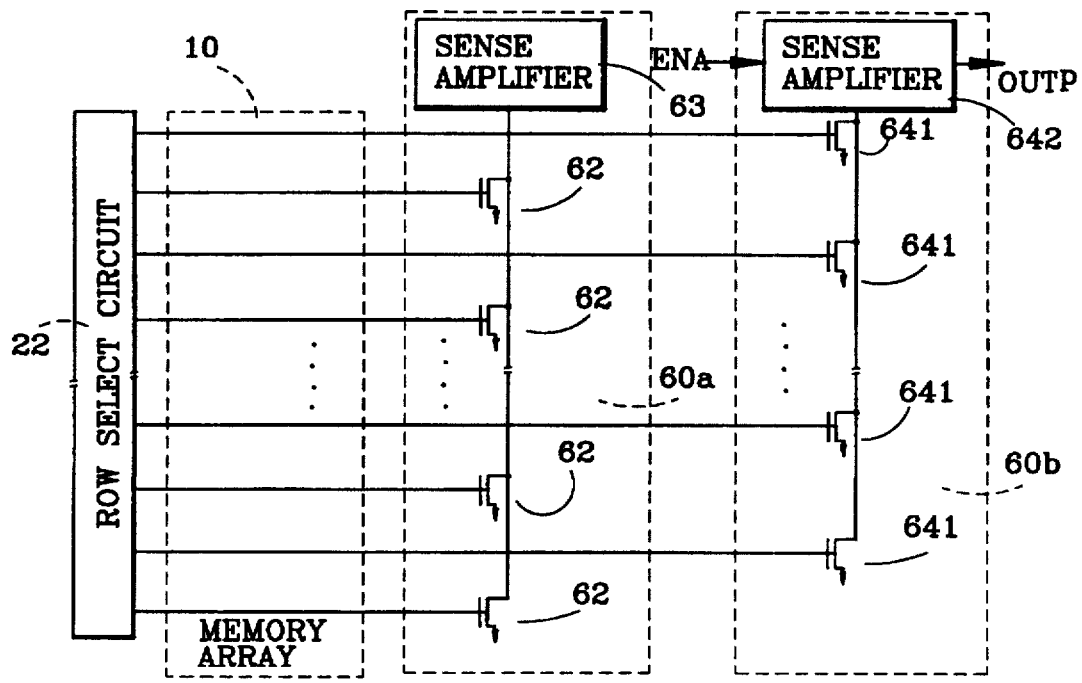
FIG. 13 illustrates another modified embodiment of a local word line short testing circuit according to the present invention.

Referring to FIG. 13, the embodiment of FIG. 12 may be further modified by adding a second local word line short testing circuit 60b which includes a plurality of transistors 641 connected to the odd word lines, and a sense amplifier 642. As such, testing of the odd word lines may be conducted in a manner similar to testing of the even word lines before the even word line test is performed or after the even word line test has been completed.

Figure 14:
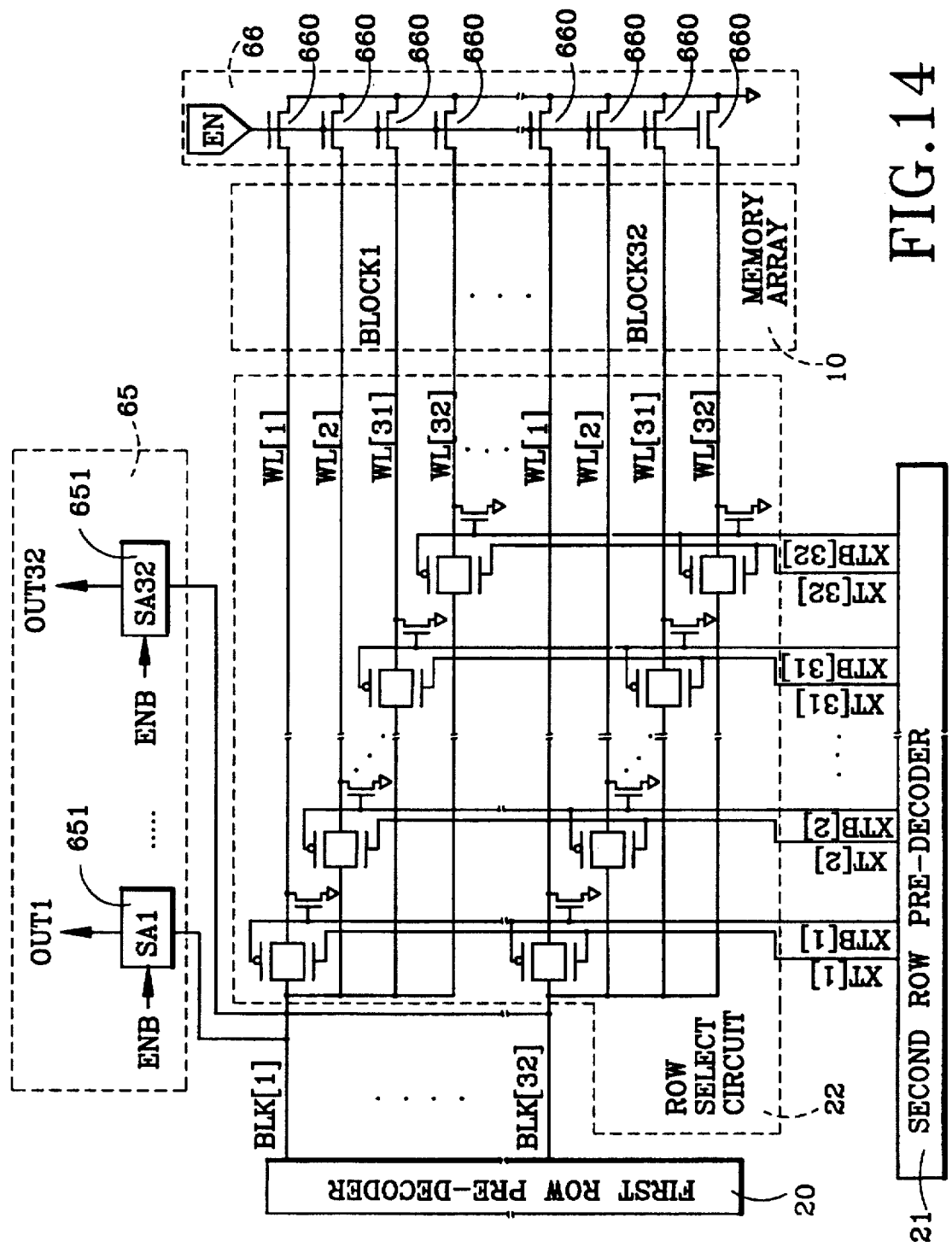
FIG. 14 illustrates how local testing for word line open defects are performed in accordance with the present invention.

FIG. 14 illustrates a preferred embodiment of the local word line open testing circuit 65 of this invention. As with the embodiment of FIG. 11, the first row pre-decoder 20 cooperates with the row select circuit 22 to group the word lines into a number of line blocks, while the second row pre-decoder 21 is operable in the local word line open testing mode so as to control the row select circuit 22 to select one of the word lines of each of the line blocks at each time. The local word line open testing circuit 65 includes a logic pulling unit 66 and a plurality of sense amplifiers 651 connected respectively to the line blocks.

The logic pulling unit 66 is connected to the word lines at one side of the memory array 10 opposite to the row select circuit 22. In this embodiment, the logic pulling unit 66 comprises a plurality of transistors 660 having grounded drain terminals, source terminals connected respectively to the word lines, and gate terminals which receive an enable signal ENB in the local word line open testing mode. The sense amplifiers 651 are preferably based on either the detector 41 shown in FIG. 3, or the detectors 52a, 57a shown in FIG. 7.

In operation, the logic pulling unit 66 and the sense amplifiers 651 are simultaneously enabled upon receipt of the enable signal ENB, whereas the first row pre-decoder 20 is disabled in the local word line open testing mode. All of the word lines are pulled to the low logic state, and the second row pre-decoder 21 controls the row select circuit 22 to select the word lines in each line block sequentially. The sense amplifiers 651 pull a corresponding one of the selected word lines to a weak high logic state and generate a low output signal OUT1–OUT32 when the corresponding one of the selected word lines remains at the weak high logic state due to open circuiting of the same.

Figure 15:
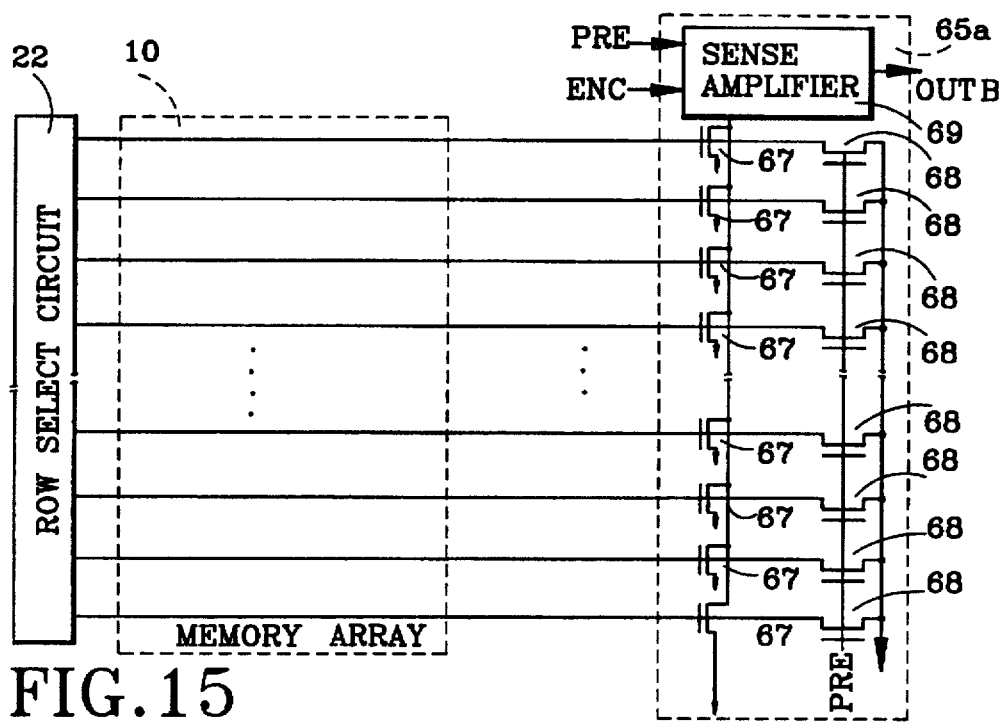
FIG. 15 illustrates a modified embodiment of a local word line open testing circuit of this invention.

The embodiment of FIG. 14 employs parallel testing of the word lines to detect open circuited ones of the word lines in a minimum amount of time. FIG. 15 illustrates a modified embodiment of the local word line open testing circuit 65a which employs serial testing of the word lines. As shown, the testing circuit 65a is connected to the word lines at another side of the memory array 10 opposite to the row select circuit 22, and includes a plurality of first transistors 67, a plurality of second transistors 68 and a sense amplifier 69. Each of the first transistors 67 has a source terminal, a gate terminal connected to a respective one of the word lines, and a grounded drain terminal. Each of the second transistors 68 has a source terminal connected to a respective one of the word lines, a grounded drain terminal and a gate terminal that receives a precharging pulse signal in the local word line open testing mode. The first and second transistors 67, 68 cooperatively form a precharging unit to pull the word lines to a weak low logic state in the local word line open testing mode. The sense amplifier 69 is connected to the source terminals of the first transistors 67.

In operation, the sense amplifier 69 and the second transistors 68 are enabled to pull all of the word lines to the weak low logic state. Thereafter, the row select circuit 22 is operated so as to pull the word lines sequentially to a high logic state. The sense amplifier 69 generates a low output signal OUTB upon detection that the word line selected by the row select circuit 22 remains in the weak low logic state due to open circuiting of the same.

Figure 16:
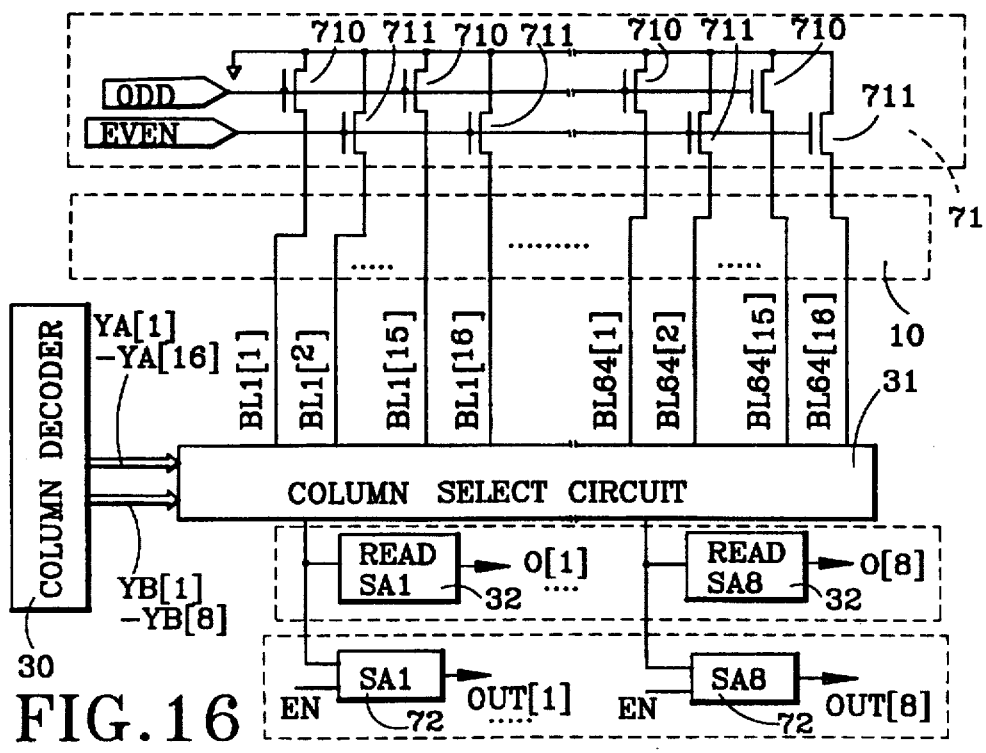
FIG. 16 illustrates how local testing for bit line short and bit line open defects are performed in accordance with the present invention.

FIG. 16 illustrates the connection among the memory array 10, the column select circuit 31, the column decoder 30, the read sense amplifiers 32, and the local bit line short/open testing circuit 70. As shown, the column select circuit 31 is connected to the bit lines at one side of the memory array 10 and is provided with eight output lines O[1]–O[8]. The column decoder 30 is connected to the column select circuit 31 and is operable so as to control the latter to select eight of the bit lines for connection with the output lines in a conventional manner. There are eight read sense amplifiers 32 connected respectively to the output lines of the column select circuit 31. The local bit line short testing circuit 70 includes a logic pulling device 71 and a plurality of sense amplifiers 72.

The logic pulling device 71 includes a plurality of first transistors 710 having source terminals connected respectively to odd ones of the bit lines at another side of the memory array opposite to the column select circuit, gate terminals that receive a first control signal ODD in a testing mode and grounded drain terminals, and a plurality of second transistors 711 having source terminals connected respectively to even ones of the bit lines opposite to the column select circuit, gate terminals that receive a second control signal EVEN in a testing mode and grounded drain terminals. Each of the sense amplifiers 72 is connected to a respective one of the output lines of the column select circuit 31.

To detect the presence of a bit line short circuit condition, the odd bit lines are tested first and the even bit lines are tested thereafter. Of course, the opposite order can also be performed.

To test the odd bit lines, the enable signal EN is generated to enable the sense amplifiers 72, the read sense amplifiers 32 are disabled, and the control signals ODD, EVEN are high and low respectively to pull down the even bit lines. The odd bit line addresses are issued sequentially to turn on the column select circuit 31. The sense amplifiers 72 pull the corresponding one of the bit lines selected by the column select circuit 31 to a weak high logic state in a manner similar to that described beforehand. The output signals OUT[1]–OUT[8] generated by the sense amplifiers 72 are at the low logic state when the corresponding bit lines are at the high logic state to indicate that no bit line short circuit has occurred. However, when one of the odd bit lines is short circuited to an adjacent even bit line, this odd bit line is pulled to the low logic state such that the output signal OUT[1]–OUT[32] generated by the corresponding sense amplifier 72 is at the high logic state to indicate the presence of a bit line short circuit condition.

To test the even bit lines, the control signals ODD, EVEN are low and high respectively to pull down the odd bit lines. The even bit line addresses are then issued sequentially to turn on the column select circuit 31. The even bit line short testing operation is similar to that for the odd bit line short testing operation and will not be described further.

To detect the presence of a bit line open circuit condition, the enable signal EN is generated to enable the sense amplifiers 72, the read sense amplifiers 32 are disabled, and the control signals ODD, EVEN are at the high logic state to pull down all of the bit lines. The bit line addresses are issued sequentially to turn on the column select circuit 31. The sense amplifiers 72 pull the corresponding one of the bit lines selected by the column select circuit 31 to a weak high logic state. The output signals OUT[1]–OUT[8] generated by the sense amplifiers 72 are at the low logic state when no bit line open circuit has occurred. However, when any of the selected bit lines is open circuited, this bit line can be pulled to the weak high logic state by the sense amplifier 72 such that the output signal OUT[1]–OUT[32] generated by the corresponding sense amplifier 72 is at the high logic state to indicate the presence of a bit line open circuit condition.

Aside from the possibility of short circuiting between or open circuiting of adjacent word lines and bit lines, short circuiting between word lines and bit lines can also occur. Therefore, there is a need to detect this kind of manufacturing defect in memory devices.

Figure 17:
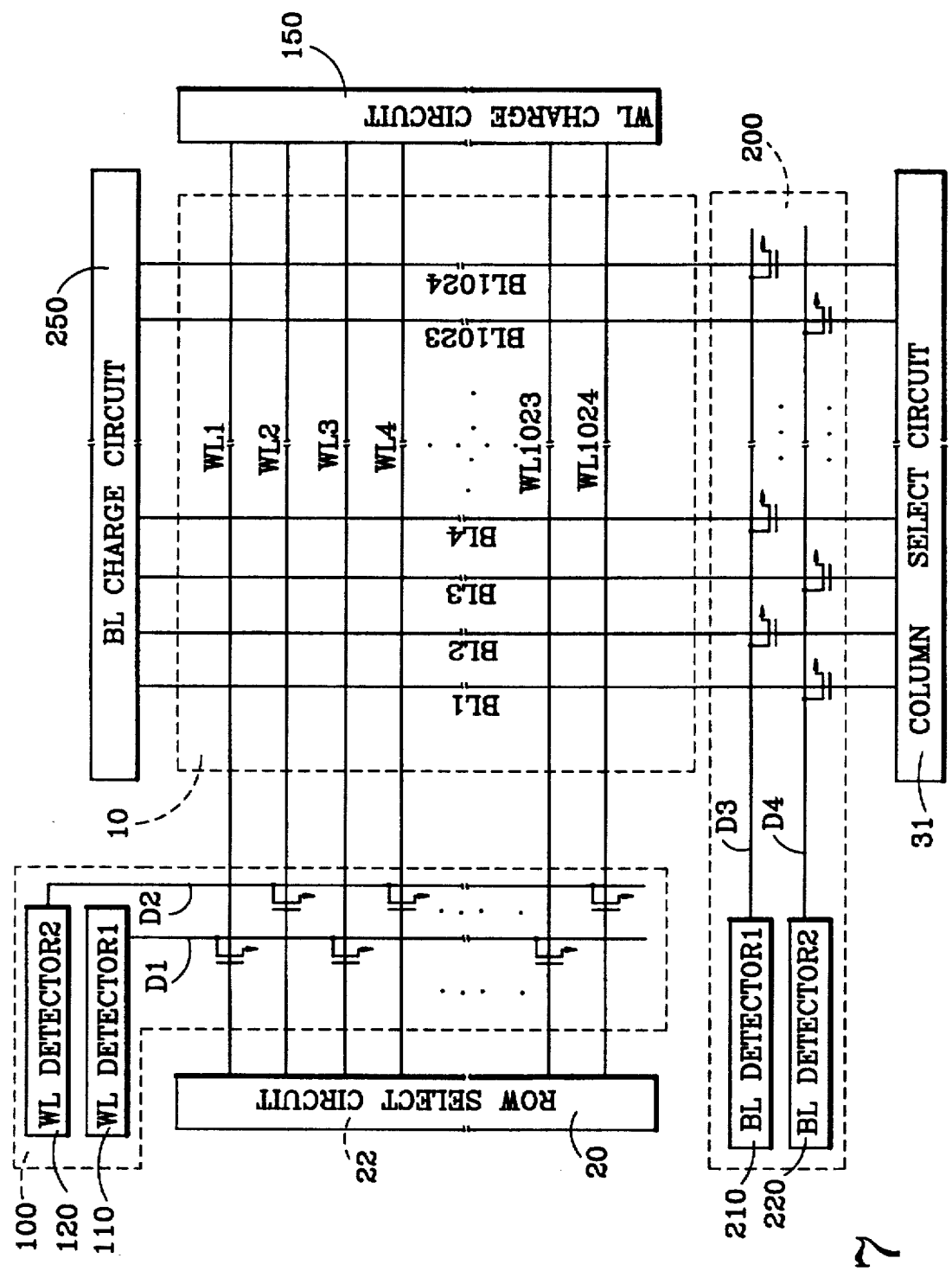
FIG. 17 illustrates another embodiment of a memory device according to the present invention.

FIG. 17 illustrates one embodiment of the memory device of the present invention which can perform word line short, word line open, bit line short, bit line open and memory cell testing. As shown, the memory device of this embodiment comprises a memory array 10, a row select circuit 20 connected to word lines of the memory array 10, a column select circuit 31 connected to bit lines of the memory array 10, a word line charge circuit 150 connected to the word lines of the memory array 10 opposite to the row select circuit 20, a bit line charge circuit 250 connected to the bit lines of the memory array 10 opposite to the column select circuit 31, a word line testing circuit 100 connected to the word lines of the memory array 10 opposite to the word line charge circuit 150, and a bit line testing circuit 200 connected to the bit lines of the memory array 10 opposite to the bit line charge circuit 250. The word line testing circuit 100 comprises a first column D1 of NOR-type transistors connected to odd ones of the word lines, a second column D2 of NOR-type transistors connected to even ones of the word lines, a first word line detector 110 connected to the first column D1 of transistors, and a second word line detector 120 connected to the second column D2 of transistors. The bit line testing circuit 200 comprises a first column D3 of NOR-type transistors connected to odd ones of the bit lines, a second column D4 of NOR-type transistors connected to even ones of the bit lines, a first bit line detector 210 connected to the first column D3 of transistors, and a second bit line detector 220 connected to the second column D4 of transistors.

During a global word line short testing operation, the even word lines are coupled to a high logic state by either the row select circuit 20 or the word line charge circuit 150, while the odd word lines are discharged to the ground and then held floating in a manner similar to described beforehand. If adjacent word lines are short circuited, then both columns D1, D2 of transistors will be pulled to the low logic state, thereby enabling the detectors 110, 120 to detect the presence of a word line short circuit condition. Alternatively, the operations for the odd and even word lines can be interchanged to achieve the same result.

During a global word line open testing operation, all of the word lines are set to the high logic state by the row select circuit 20. Then, all of the word lines are grounded by the word line charge circuit 150. If there are no open circuited word lines, all of the word lines will be discharged from the high logic state to the low logic state, and the columns D1, D2 are both at the high logic state. If any of the word lines is open circuited, the open circuited word line will remain in the high logic state, and the corresponding one of the columns D1, D2 will be pulled to the low logic state, thereby enabling the detectors 110, 120 to detect the presence of a word line open circuit condition.

The global bit line short and bit line open operations, which are performed by the bit line testing circuit 200 and the bit line charge circuit 250, are generally similar to those for the global word line short and word line open operations and will not be described further.

When detecting the presence of a short circuit between word lines and bit lines, all word lines are initially coupled to the logic high state. Then, all bit lines are discharged to the low logic state and are subsequently held floating or connected to a weak pull down. If there is a short circuit between one of the word lines and one of the bit lines, at least one of the bit lines will be pulled to the high logic state to discharge either the first column D3 or the second column D4. As such, the short circuit between the word lines and the bit lines can be detected. Similarly, all bit lines can be initially coupled to the logic high state. Then, all word lines are discharged to the low logic state and are subsequently held floating or connected to a weak pull down. If there is a short circuit between one of the word lines and one of the bit lines, at least one of the word lines will be pulled to the high logic state to discharge either the first column D1 or the second column D2 to permit detection of the short circuit.

In non-volatile memory devices, the threshold voltages of the memory cell on a word line varies widely, such as from 1 to 2 volts up to 5 to 6 volts. In some applications, there is a need to detect the maximum threshold voltage in selected word lines. In the embodiment of FIG. 17, to detect the maximum threshold voltage, all word lines are grounded by either the row select circuit 20 or the word line charge circuit 150. All bit lines are then precharged to the high logic state by the bit line charge circuit 250. As such, the first and second columns D3, D4 are initially at the low logic state. Assuming that some of the memory cells have a maximum threshold voltage of 6 volts, the first and second columns D3, D4 are kept in the low logic state unless the applied word line read voltage is higher than 6 volts. When the word line read voltage is higher than 6 volts, the first or second column D3, D4 will be pulled to the high logic state, depending on whether the memory cells with the maximum threshold voltage are in the odd or even columns of the memory array 10. As such, detection of the maximum threshold voltage of the memory cells in selected odd or even word lines is thus achieved.

Figure 18:
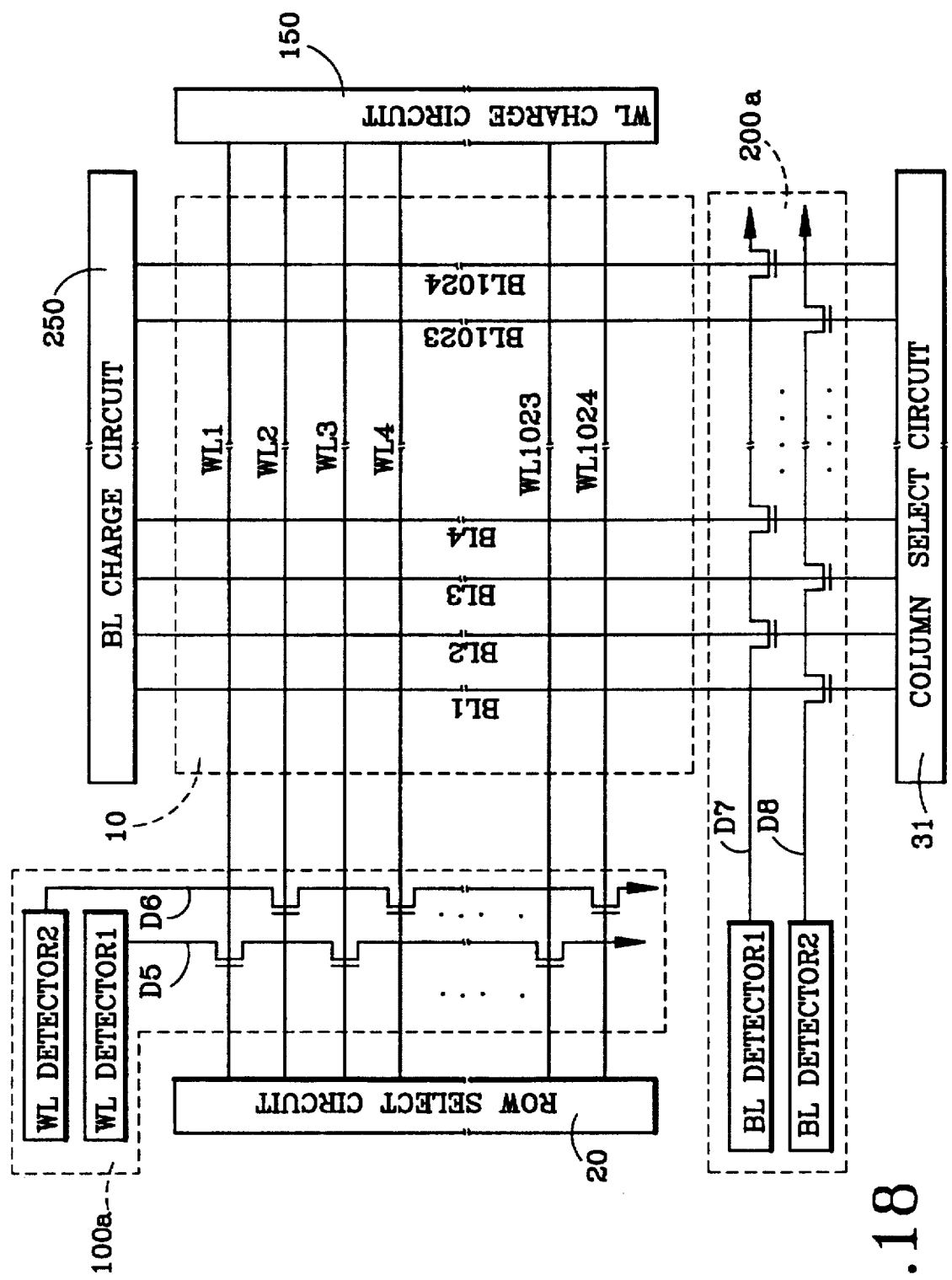
FIG. 18 illustrates still another embodiment of a memory device according to the present invention.

FIG. 18 illustrates a modified version of the embodiment of FIG. 17. The embodiment of FIG. 18 is generally similar to the embodiment of FIG. 17, except that NAND-type transistors are used in the first and second transistor columns D5, D6 of the word line testing circuit 100a and in the first and second transistor columns D7, D8 of the bit line testing circuit 200a. Also, instead of detecting the maximum threshold voltage of the memory cells, the testing circuit 200a can be used to detect the minimum threshold voltage of the memory cells.

Note that the embodiments of FIGS. 17 and 18 can be further modified so that defect detection can be done locally in a manner similar to that employed in the preceding embodiments.

Moreover, the testing circuits 100, 200, 100a, 200a may be configured to include a greater number of transistor columns for more efficient operation but at the expense of a larger silicon area. The testing circuits 100, 200, 100a, 200a can be further configured to use PMOS transistors instead of NMOS transistors to achieve the same performance.

Finally, during precharging, the bit lines are preferably charged to the level of 1 volt, instead of Vdd, for non-volatile memory devices, such as ROM, EPROM, EEPROM and Flash, to minimize bit line stress. For SRAM and DRAM memory devices, precharging to Vdd is permitted without device degradation.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A memory device with an on-chip manufacturing defect detection capability, comprising:
- a memory array including a plurality of memory cells organized in rows and columns, a plurality of word lines interconnecting respectively said rows of said memory cells, and a plurality of bit lines interconnecting respectively said columns of said memory cells, one of said plurality of word lines and said plurality of bit lines being grouped into odd and even access lines, each of said even access lines being disposed between adjacent two of said odd access lines; and
- a global access line short testing circuit including
  - first means connected to said even access lines and activable in a testing mode to pull said even access lines to a first logic state;
  - second means connected to said odd access lines and activable in the testing mode to pull said odd access lines to a second logic state opposite to the first logic state; and
  - a global access line short detector connected to one of said first and second means and activable in the testing mode to generate an output signal when said even access lines are pulled to the second logic state or when said odd access lines are pulled to the first logic state due to a short circuit between one of said even access lines and one of said odd access lines.

2. The memory device of claim 1, wherein the first logic state is a high logic state, and said first means comprises:
- a plurality of first transistors connected in series and having gate terminals connected respectively to said even access lines, said first transistor connected to a first one of said even access lines having a source terminal connected to said detector, said first transistor connected to a last one of said even access lines having a grounded drain terminal; and
- a plurality of second transistors having source terminals connected to a voltage source, drain terminals connected respectively to said even access lines, and gate terminals which receive an enable signal in the testing mode.

3. The memory device of claim 2, wherein said second means comprises a plurality of third transistors having source terminals connected respectively to said odd access lines, grounded drain terminals, and gate terminals which receive the enable signal in the testing mode.

4. The memory device of claim 3, wherein said second transistors are formed as medium-channel transistors.

5. The memory device of claim 1, wherein the first logic state is a low logic state, and said second means comprises:
- a plurality of first transistors connected in series and having gate terminals connected respectively to said odd access lines, said first transistor connected to a last one of said odd access lines having a source terminal connected to said detector, said first transistor connected to a first one of said odd access lines having a grounded drain terminal; and
- a plurality of second transistors having source terminals connected to a voltage source, drain terminals connected respectively to said odd access lines, and gate terminals which receive an enable signal in the testing mode.

6. The memory device of claim 5, wherein said first means comprises a plurality of third transistors having source terminals connected respectively to said even access lines, grounded drain terminals, and gate terminals which receive the enable signal in the testing mode.

7. The memory device of claim 6, wherein said second transistors are formed as medium-channel transistors.

8. The memory device of claim 5, wherein said first means comprises an access line select circuit.

9. The memory device of claim 1, further comprising local access line testing means connected to said access lines for identifying short circuited ones of said access lines.

10. A memory device with an on-chip manufacturing defect detection capability, comprising:
- a memory array including a plurality of memory cells organized in rows and columns, and a plurality of access lines interconnecting respectively one of said rows and columns of said memory cells;
- a select circuit connected to said access lines at one side of said memory array and operable in a testing mode to pull said access lines to a first logic state; and
- a global access line open testing circuit including
  - precharging means connected to said access lines on another side of said memory array opposite to said select circuit and activable in the testing mode to pull said access lines to a second logic state opposite to the first logic state; and
  - a global access line open detector connected to said precharging means and activable in the testing mode to generate an output signal when any one of said access lines remains in the second logic state due to open circuiting of said any one of said access lines.

11. The memory device of claim 10, wherein the first logic state is a high logic state, and said precharging means comprises:
- a plurality of first transistors connected in series and having gate terminals connected respectively to said access lines, said first transistor connected to a first one of said access lines having a source terminal connected to said detector, said first transistor connected to a last one of said access lines having a grounded drain terminal; and a plurality of said second transistors having grounded drain terminals, source terminals connected respectively to said access lines, and gate terminals which receive an enable signal in the testing mode.

12. The memory device of claim 11, wherein said second transistors are formed as medium-channel transistors.

13. The memory device of claim 10, wherein the first logic state is a low logic state, and said precharging means comprises:

a plurality of first transistors having gate terminals connected respectively to said access lines, source terminals connected to said detector, and grounded drain terminals; and a plurality of second transistors having source terminals connected to a voltage source, drain terminals connected respectively to said access lines, and gate terminals which receive an enable signal in the testing mode.

14. The memory device of claim 13, wherein said second transistors are formed as medium-channel transistors.

15. The memory device of claim 10, wherein the first logic state is a low logic state, and said precharging means comprises:

a plurality of first transistors connected in series and having gate terminals connected respectively to said access lines, said first transistor connected to a first one of said access lines having a source terminal connected to a voltage source, said first transistor connected to a last one of said access lines being connected to said detector; and a plurality of second transistors having source terminals connected to a voltage source, drain terminals connected respectively to said access lines, and gate terminals which receive an enable signal in the testing mode.

16. The memory device of claim 15, wherein said second transistors are formed as medium-channel transistors.

17. The memory device of claim 10, further comprising local access line testing means connected to said access lines for identifying open circuited ones of said access lines.

18. A memory device with an on-chip manufacturing defect detection capability, comprising:

a memory array including a plurality of memory cells organized in rows and columns, and a plurality of word lines interconnecting respectively said rows of said memory cells;

a row select circuit connected to said word lines;

a first row pre-decoder connected to said row select circuit to group said word lines into a number of line blocks, said first row pre-decoder being capable of being disabled in a testing mode;

a second row pre-decoder connected to said row select circuit and operable in the testing mode so as to control said row select circuit to select one of said word lines of each of said line blocks at each time; and a local word line short testing circuit including a plurality of sense amplifiers connected respectively to said line blocks and activable in the testing mode to pull a corresponding one of said selected word lines to a first logic state and to generate an output signal upon detection that the corresponding one of said selected word lines is at a second logic state opposite to the first logic state due to short circuiting with an adjacent non-selected one of said word lines.

19. The memory device of claim 18, wherein the first logic state is a high logic state, and each of said sense amplifiers comprises:

a switching transistor having a source terminal, a gate terminal which receives an enable signal in the testing mode, and a drain terminal connected to the respective one of said line blocks, said output signal being obtained from said source terminal of said switching transistor; and a pull-up transistor interconnected said source terminal of said switching transistor and a voltage source.

20. The memory device of claim 19, wherein said pull-up transistor is formed as a medium-channel transistor.

21. The memory device of claim 19, wherein said pull-up transistor has a gate terminal that receives a precharging pulse signal in the testing mode, the enable signal being generated after a lagging edge of the precharging pulse signal.

22. A memory device with an on-chip manufacturing defect detection capability, comprising:

a memory array including a plurality of memory cells organized in rows and columns, and a plurality of word lines interconnecting respectively said rows of said memory cells, said word lines being grouped into a plurality of odd lines and a plurality of even lines, each of said even lines being disposed between adjacent two of said odd lines;

a row select circuit connected to said word lines and operable in a testing mode so as to pull one of said plurality of odd lines and said plurality of even lines sequentially to a first logic state; and a local word line short testing circuit including a plurality of transistors having source terminals, gate terminals connected respectively to the other one of said plurality of odd lines and said plurality of even lines not pulled by said row select circuit to the first logic state, and grounded drain terminals; and a sense amplifier connected to said source terminals of said transistors and activable in the testing mode to pull the other one of said plurality of odd lines and said plurality of even lines to a second logic state opposite to the first logic state, and to generate an output signal upon detection that one of said word lines connected to said sense amplifier is pulled to the first logic state by one of said word lines pulled by said row select circuit due to short circuiting therewith.

23. A memory device with an on-chip manufacturing defect detection capability, comprising:

a memory array including a plurality of memory cells organized in rows and columns, and a plurality of word lines interconnecting respectively said rows of said memory cells;

a row select circuit connected to said word lines at one side of said memory array;

a first row pre-decoder connected to said row select circuit to group said word lines into a number of line blocks, said first row pre-decoder being capable of being disabled in a testing mode;

a second row pre-decoder connected to said row select circuit and operable in the testing mode so as to control said row select circuit to select one of said word lines of each of said line blocks at each time; and a local word line open testing circuit including logic pulling means connected to said word lines at another side of said memory array opposite to said row select circuit and operable in the testing mode to pull said word lines to a first logic state; and a plurality of sense amplifiers connected respectively to said line blocks and activable in the testing mode to pull a corresponding one of said selected word lines to a second logic state opposite to said first logic state and to generate an output signal upon detection that the corresponding one of said selected word lines remains at the second logic state due to open circuiting of the corresponding one of said selected word lines.

24. The memory device of claim 23, wherein the first logic state is a low logic state, and each of said sense amplifiers comprises:
  a switching transistor having a source terminal, a gate terminal which receives an enable signal in the testing mode, and a drain terminal connected to the respective one of said line blocks, said output signal being obtained from said source terminal of said switching transistor; and
  a pull-up transistor interconnected said source terminal of said switching transistor and a voltage source.

25. The memory device of claim 24, wherein said pull-up transistor is formed as a medium-channel transistor.

26. The memory device of claim 24, wherein said pull-up transistor has a gate terminal that receives a precharging pulse signal in the testing mode, the enable signal being generated after a lagging edge of the precharging pulse signal.

27. The memory device of claim 23, wherein the first logic state is a low logic state and said logic pulling means comprises a plurality of transistors having grounded drain terminals, source terminals connected respectively to said word lines, and gate terminals that receive an enable signal in the testing mode.

28. A memory device with an on-chip manufacturing defect detection capability, comprising:
  a memory array including a plurality of memory cells organized in rows and columns, and a plurality of word lines interconnecting respectively said rows of said memory cells;
  a row select circuit connected to said word lines at one side of said memory array and operable in a testing mode so as to pull said word lines sequentially to a first logic state; and
  a local word line open testing circuit including
    precharging means connected to said word lines at another side of said memory array opposite to said row select circuit and activable in the testing mode to pull said word lines to a second logic state opposite to the first logic state; and
    a sense amplifier connected to said precharging means and activable in the testing mode to generate an output signal upon detection that one of said word lines selected by said row select circuit remains in the second logic state due to open circuiting thereof.

29. The memory device of claim 28, wherein the first logic state is a high logic state, and said precharging means comprises:
  a plurality of first transistors having source terminals connected to said sense amplifier, gate terminals connected respectively to said word lines, and grounded drain terminals; and
  a plurality of second transistors having source terminals connected respectively to said word lines, grounded drain terminals and gate terminals that receive a precharging pulse signal in the testing mode.

30. A memory device with an on-chip manufacturing defect detection capability, comprising:
  a memory array including a plurality of memory cells organized in rows and columns, and a plurality of bit lines interconnecting respectively said columns of said memory cells;
  a column select circuit connected to said bit lines at one side of said memory array and provided with a number of output lines;
  a column decoder connected to said column select circuit and operable so as to control said column select circuit to select a number of said bit lines for connection with said output lines;
  a number of read sense amplifiers connected respectively to said output lines and being capable of being disabled in a testing mode; and
  a local bit line short testing circuit including
    logic pulling means connected to one of odd and even ones of said bit lines at another side of said memory array opposite to said column select circuit and operable in the testing mode to pull said one of said odd and even ones of said bit lines to a first logic state; and
    a plurality of sense amplifiers connected respectively to said output lines of said column select circuit and activable in the testing mode to pull a corresponding one of said bit lines selected by said column select circuit to a second logic state opposite to said first logic state and to generate an output signal upon detection that the corresponding one of said selected bit lines is at the first logic state due to short circuiting with an adjacent non-selected one of said bit lines.

31. A memory device with an on-chip manufacturing defect detection capability, comprising:
  a memory array including a plurality of memory cells organized in rows and columns, and a plurality of bit lines interconnecting respectively said columns of said memory cells;
  a column select circuit connected to said bit lines at one side of said memory array and provided with a number of output lines;
  a column decoder connected to said column select circuit and operable so as to control said column select circuit to select a number of said bit lines for connection with said output lines;
  a number of read sense amplifiers connected respectively to said output lines and being capable of being disabled in a testing mode; and
  a local bit line open testing circuit including
    logic pulling means connected to said bit lines at another side of said memory array opposite to said column select circuit and operable in the testing mode to pull said bit lines to a first logic state; and
    a plurality of sense amplifiers connected respectively to said output lines of said column select circuit and activable in the testing mode to pull a corresponding one of said bit lines selected by said column select circuit to a second logic state opposite to said first logic state and to generate an output signal upon detection that the corresponding one of said selected bit lines remains at the first logic state due to open circuiting thereof.

32. A memory device with an on-chip memory cell defect detection capability, comprising:
  a memory array including a plurality of memory cells organized in rows and columns, a plurality of word lines interconnecting respectively said rows of said memory cells, and a plurality of bit lines interconnecting respectively said columns of said memory cells;

row select means connected to said word lines and operable in a program mode for programming said memory cells, an erasing mode for erasing said memory cells, a program verify mode for applying a program verify voltage to a selected one of said word lines to verify programming of said memory cells on the selected one of said word lines, and an erase verify mode for applying an erase verify voltage to the selected one of said word lines to verify erasing of said memory cells on the selected one of said word lines; and a testing circuit connected to said bit lines for generating an output signal, upon detection that one of said bit lines remains in an unprogrammed or unerased logic state when the program verify or erase verify voltage is generated after a programming or erasing operation, to verify that at least one of said memory cells on the selected one of said word lines is defective.

33. A memory device with an on-chip memory cell threshold voltage detection capability, comprising:

a memory array including a plurality of memory cells organized in rows and columns, a plurality of word lines interconnecting respectively said rows of said memory cells, and a plurality of bit lines interconnecting respectively said columns of said memory cells;

row select means connected to said word lines and operable in a testing mode for applying a varying word line voltage to a selected one of said word lines; and a testing circuit connected to said bit lines for generating an output signal upon detecting a change in logic state of at least one of said memory cells on the selected one of said word lines due to the varying word line voltage applied thereto.

34. The memory device of claim 33, wherein the threshold voltage is a minimum threshold voltage.

35. The memory device of claim 34, wherein the word line voltage varies from a low logic state to a high logic state, and the output signal is generated when any of said memory cells on the selected one of said word lines is turned on.

36. The memory device of claim 34, wherein the word line voltage varies from a high logic state to a low logic state, and the output signal is generated when all of said memory cells on the selected one of said word lines are turned on.

37. The memory device of claim 33, wherein the threshold voltage is a maximum threshold voltage.

38. The memory device of claim 37, wherein the word line voltage varies from a low logic state to a high logic state, and the output signal is generated when all of said memory cells on the selected one of said word lines are turned on.

39. The memory device of claim 37, wherein the word line voltage varies from a high logic state to a low logic state, and the output signal is generated when any of said memory cells on the selected one of said word lines is turned off.

40. A memory device with an on-chip manufacturing defect detection capability, comprising:

a memory array including a plurality of memory cells organized in rows and columns, a plurality of word lines interconnecting respectively said rows of said memory cells, and a plurality of bit lines interconnecting respectively said columns of said memory cells;

first means connected to one of said plurality of word lines and said plurality of bit lines and activable in a testing mode to pull said one of said plurality of word lines and said plurality of bit lines to a first logic state;

second means connected to other one of said plurality of word lines and said plurality of bit lines and activable in a testing mode to pull said other one of said plurality of word lines and said plurality of bit lines to a second logic state opposite to said first logic state; and a testing circuit connected to one of said first and second means and activable in the testing mode to generate an output signal when said one of said plurality of word lines and said plurality of bit lines are pulled to the second logic state or when said other one of said plurality of word lines and said plurality of bit lines are pulled to the first logic state due to a short circuit between one of said word lines and one of said bit lines.

* * * * *